United States Patent [19]

Elliott

[11] 4,010,476
[45] Mar. 1, 1977

[54] METHODS AND APPARATUS FOR RECORDING WELL LOGGING MEASUREMENTS

[75] Inventor: Jennings W. Elliott, West Redding, Conn.

[73] Assignee: Schlumberger Technology Corporation, New York, N.Y.

[22] Filed: Nov. 4, 1974

[21] Appl. No.: 520,957

Related U.S. Application Data

[60] Division of Ser. No. 15,790, March 2, 1970, abandoned, which is a continuation of Ser. No. 520,956, Nov. 4, 1974.

[52] U.S. Cl. .................................. 346/1; 315/383; 340/15.5 DS; 340/324 AD; 346/33 WL; 346/45; 346/110 R

[51] Int. Cl.² ....................................... G01D 9/00

[58] Field of Search ............ 346/1, 33 WL, 45, 49, 346/108, 110; 340/15.5 DS, 324 A, 324 AD; 315/383, 384, 385, 386, 30

[56] References Cited

UNITED STATES PATENTS

| | | | |
|---|---|---|---|
| 2,700,741 | 1/1955 | Brown et al. | 315/386 |
| 2,811,665 | 10/1957 | McNaney | 340/324 A |
| 3,213,447 | 10/1965 | Burrows et al. | 343/7 TA |
| 3,473,079 | 10/1969 | Adornetto et al. | 315/385 |
| 3,502,937 | 3/1970 | Bader et al. | 315/383 |
| 3,603,963 | 9/1971 | Ward | 340/324 A |

*Primary Examiner*—Joseph W. Hartary
*Attorney, Agent, or Firm*—Brumbaugh, Graves, Donohue & Raymond

[57] ABSTRACT

In accordance with illustrative embodiments of the present invention, data signals, particularly well logging data in analog or digital form, is recorded by a cathode ray tube recorder. A representation of the CRT beam is repetitively swept across a recording medium while being modulated with representations of the well logging signals. This modulation varies as a function of the rate of change of the well logging signals to produce an even density recording. Coding of the recording lines or traces and the areas between selected traces can be accomplished. This coding of the lines is also varied in dependence on the well logging signal rate of change to produce a uniform coding presentation. Depth information can be recorded on the recording medium by writing depth numbers and depth lines on the record medium. Moreover, a section by section visual presentation of the data can be produced while it is being recorded.

27 Claims, 69 Drawing Figures

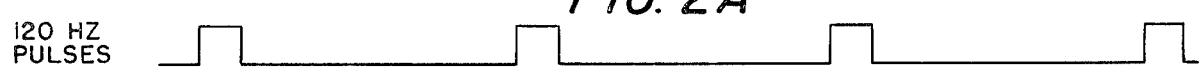
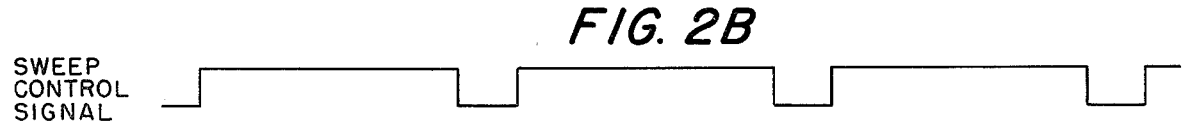
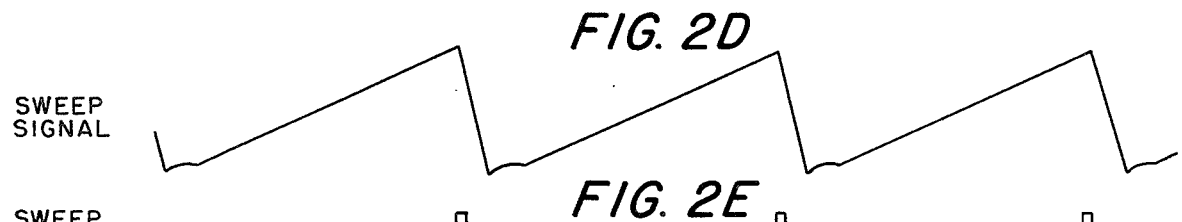
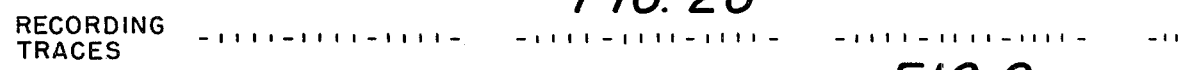
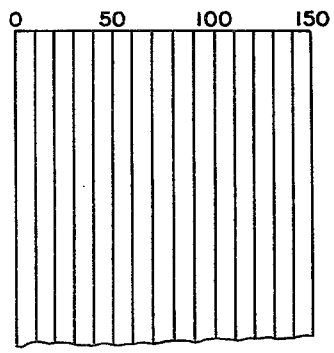
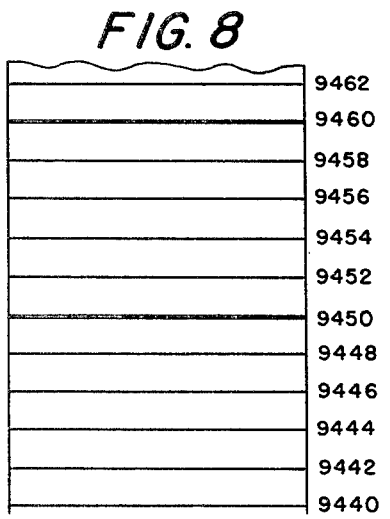
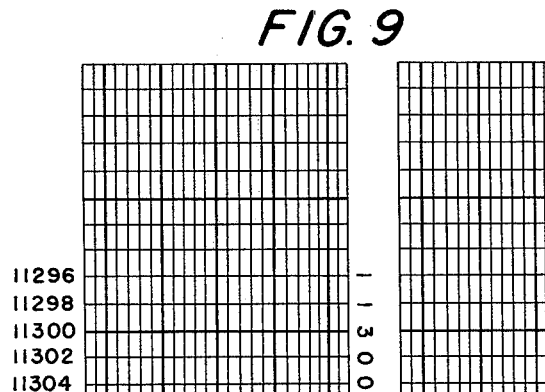

FIG. 5A
CONVERTERS 95 & 96 SEQUENCES
| 06 | 04 | 02 | 00 | 98 | 96 | 95 | 94 | 93 | 92 | 91 |
FIG. 5B
AND GATE 97 
FIG. 5C
FLIP-FLOP 98 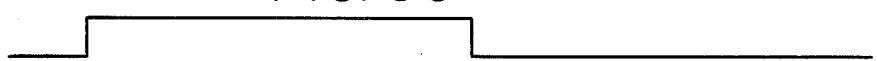
FIG. 5D
GATED 2' DEPTH SIGNAL 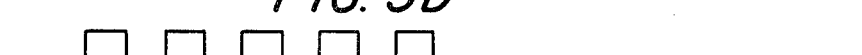
FIG. 5E
BINARY COUNTER 101 SEQUENCES
| 0 | 1 | 2 | 3 | 4 | 5 | | 0 |
FIG. 5F
AND GATE 111 
FIG. 5G
ONE-SHOT 102 — PRINT A ZERO 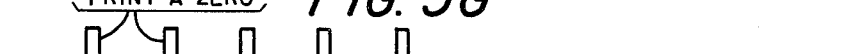
FIG. 5H
GATES 106 — PRINT HUNDREDS DIGIT 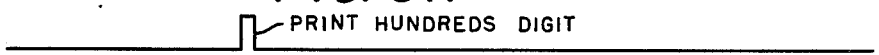
FIG. 5I
GATES 107 — PRINT THOUSANDS DIGIT 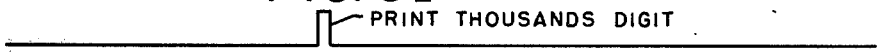
FIG. 5K
GATES 109 — PRINT TEN-THOUSAND DIGIT 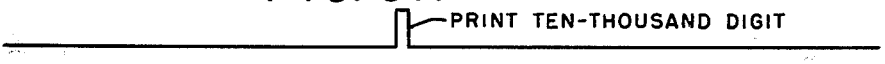
FIG. 6A
2' DEPTH SIGNAL 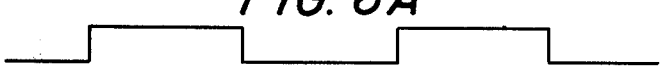
FIG. 6B
SWEEP RESET PULSES 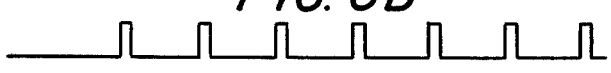
FIG. 6C
N OUTPUT OF F-F 125 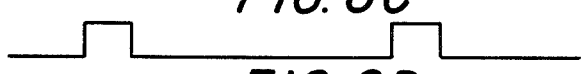
FIG. 6D
OUTPUT OF AND GATE 126 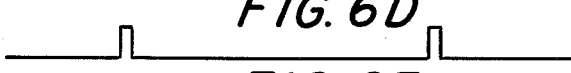
FIG. 6E
N OUTPUT OF F-F 127 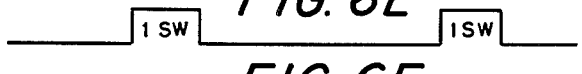
FIG. 6F
OUTPUT OF NAND GATE 131 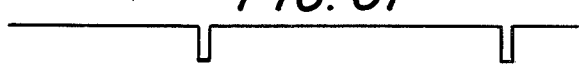

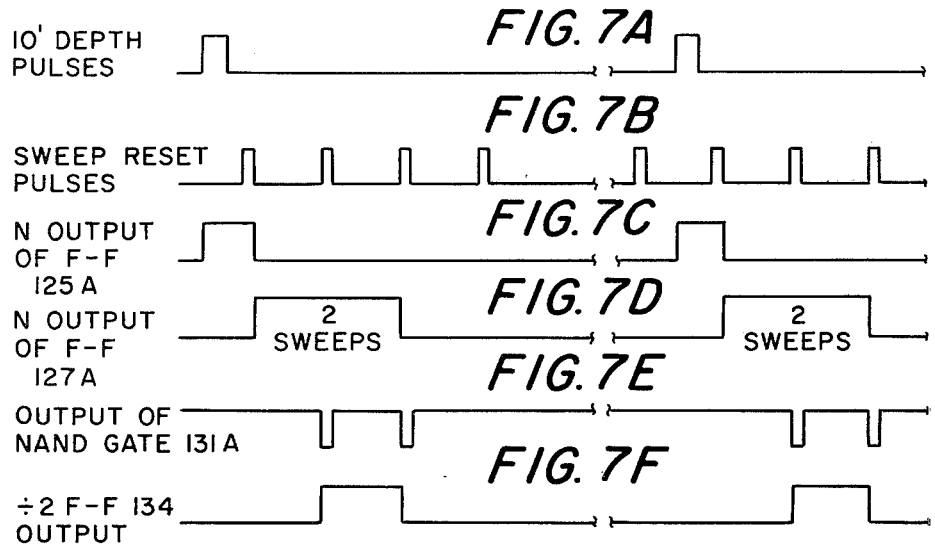
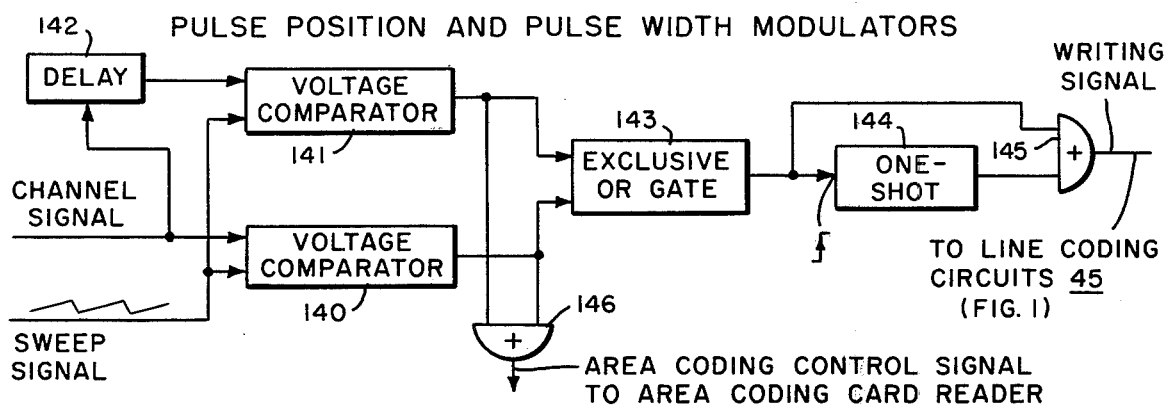
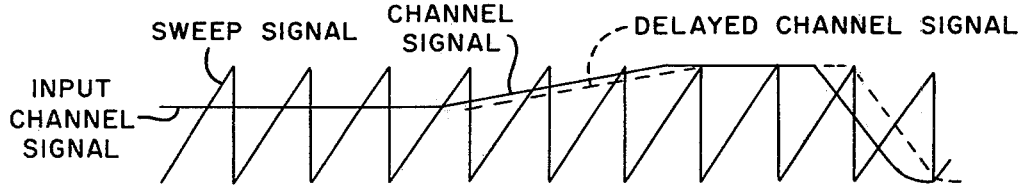
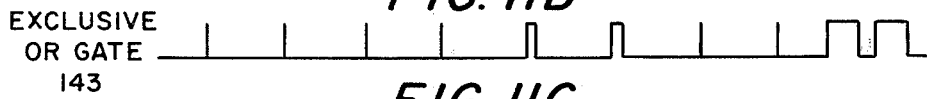
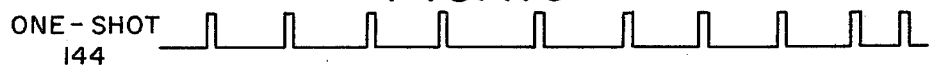
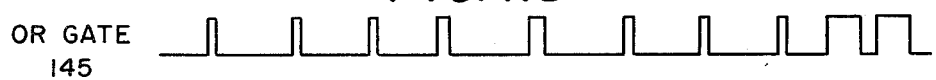
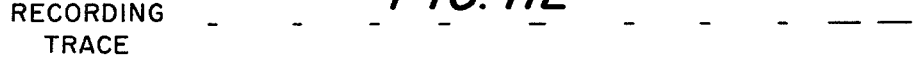

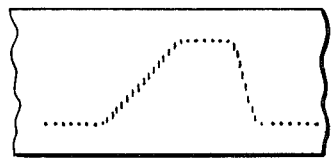
FIG. 12
FIG. 16A
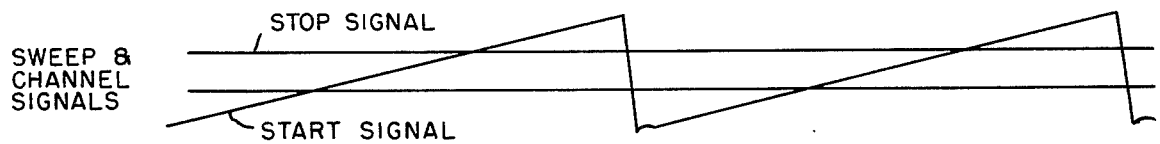
FIG. 16B
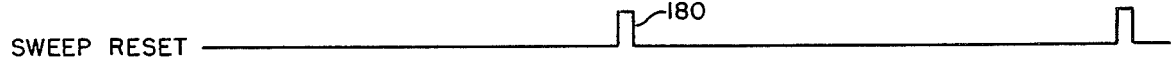
FIG. 16C
FIG. 16D
FIG. 16E
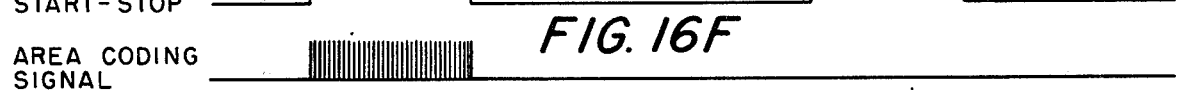
FIG. 16F
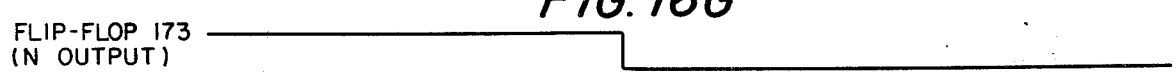
FIG. 16G
FIG. 13
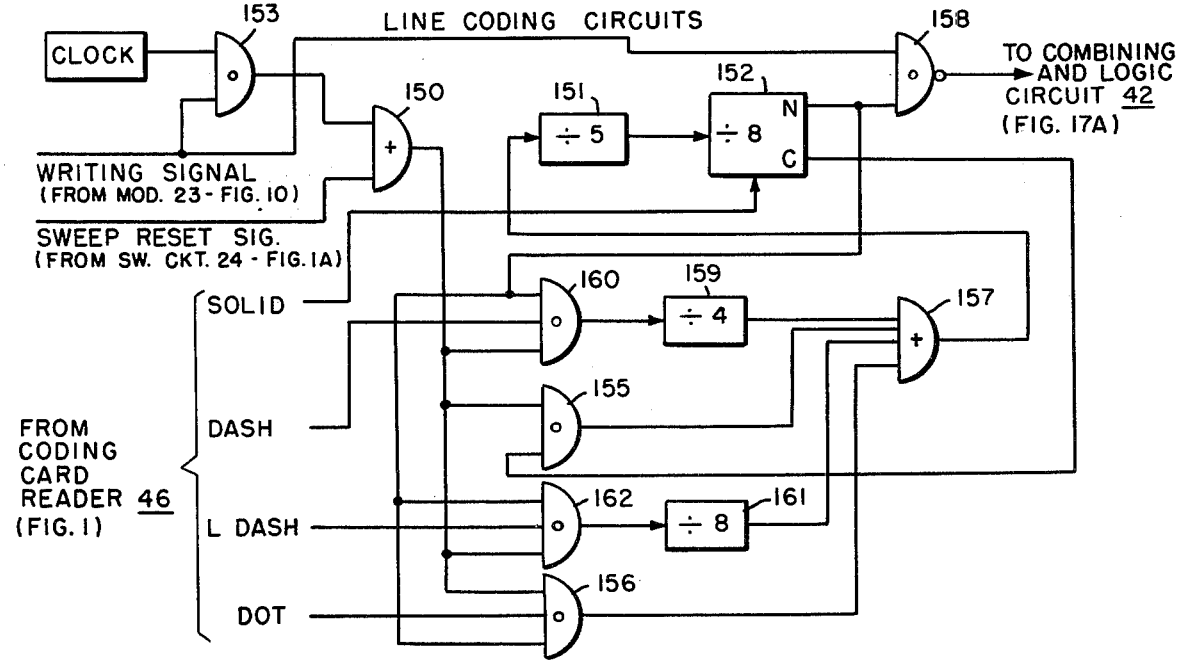

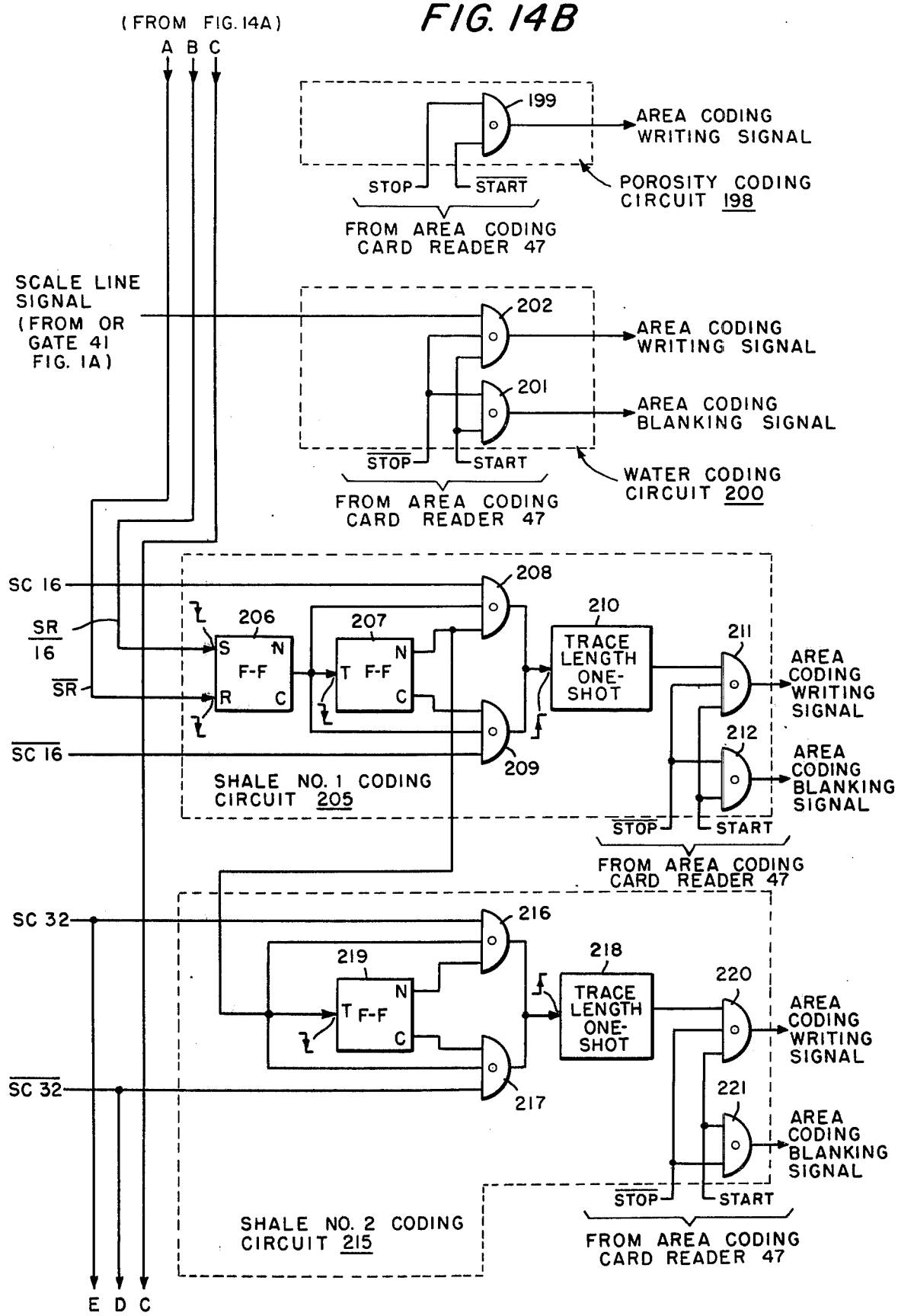

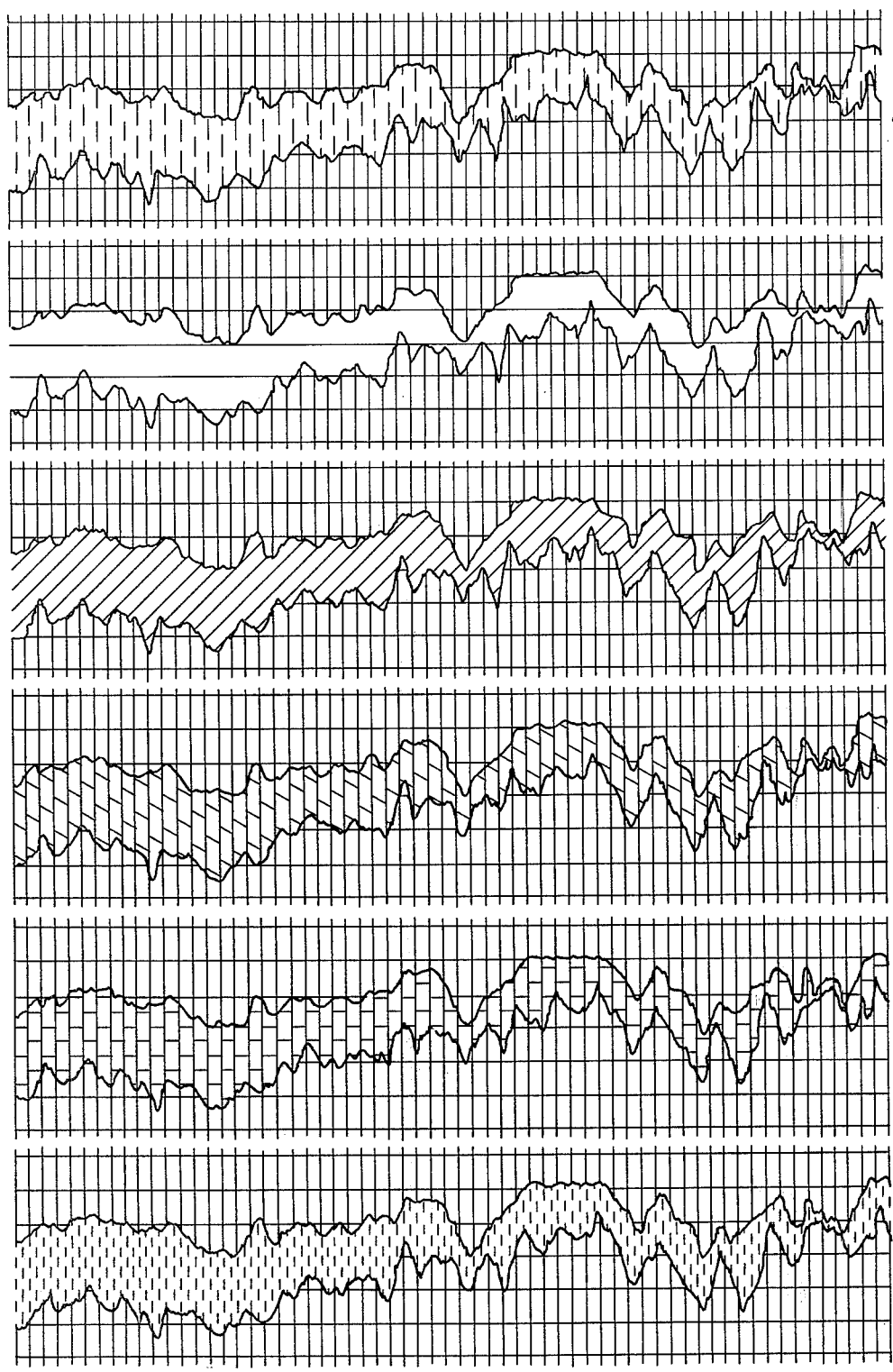

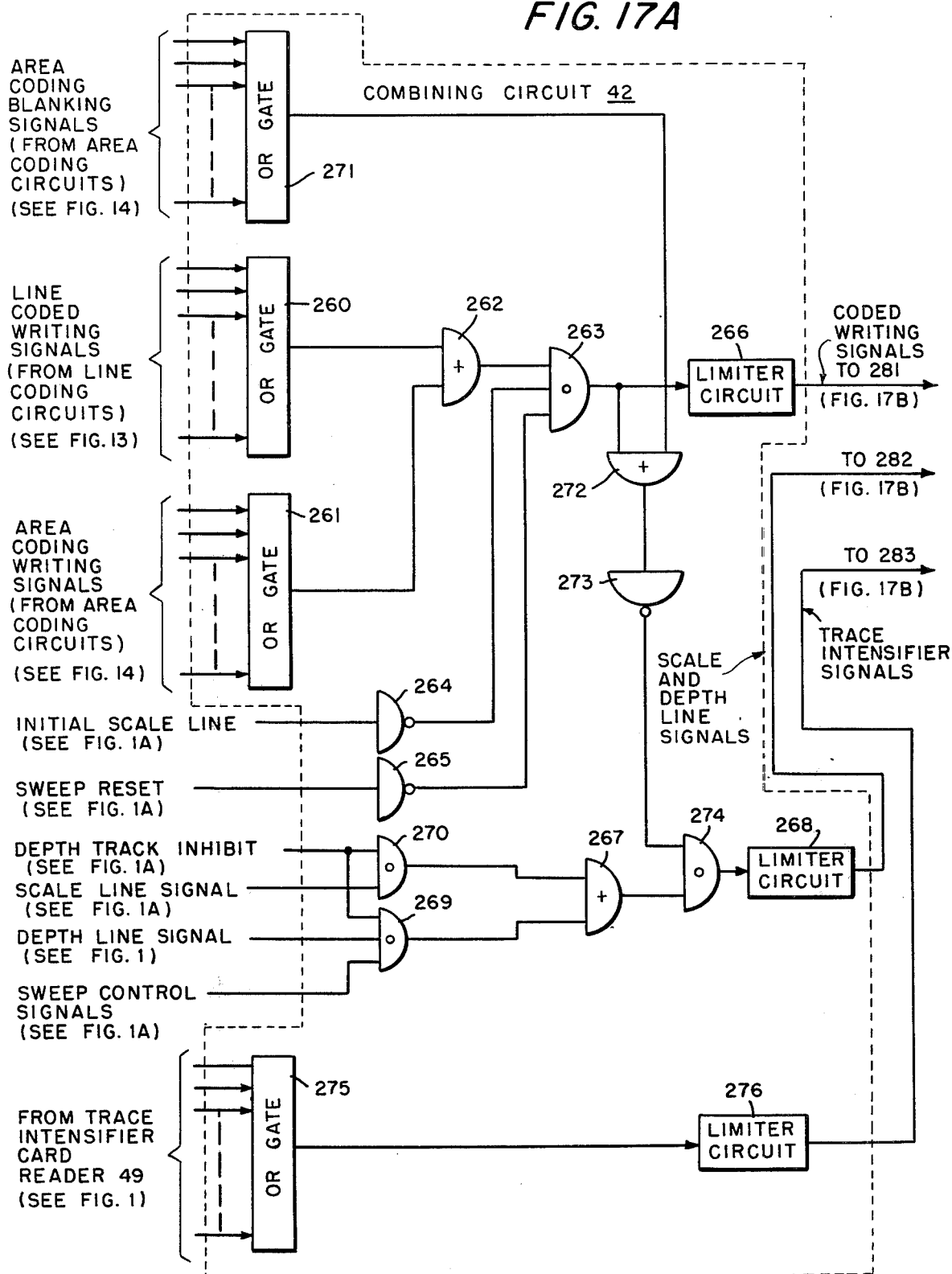

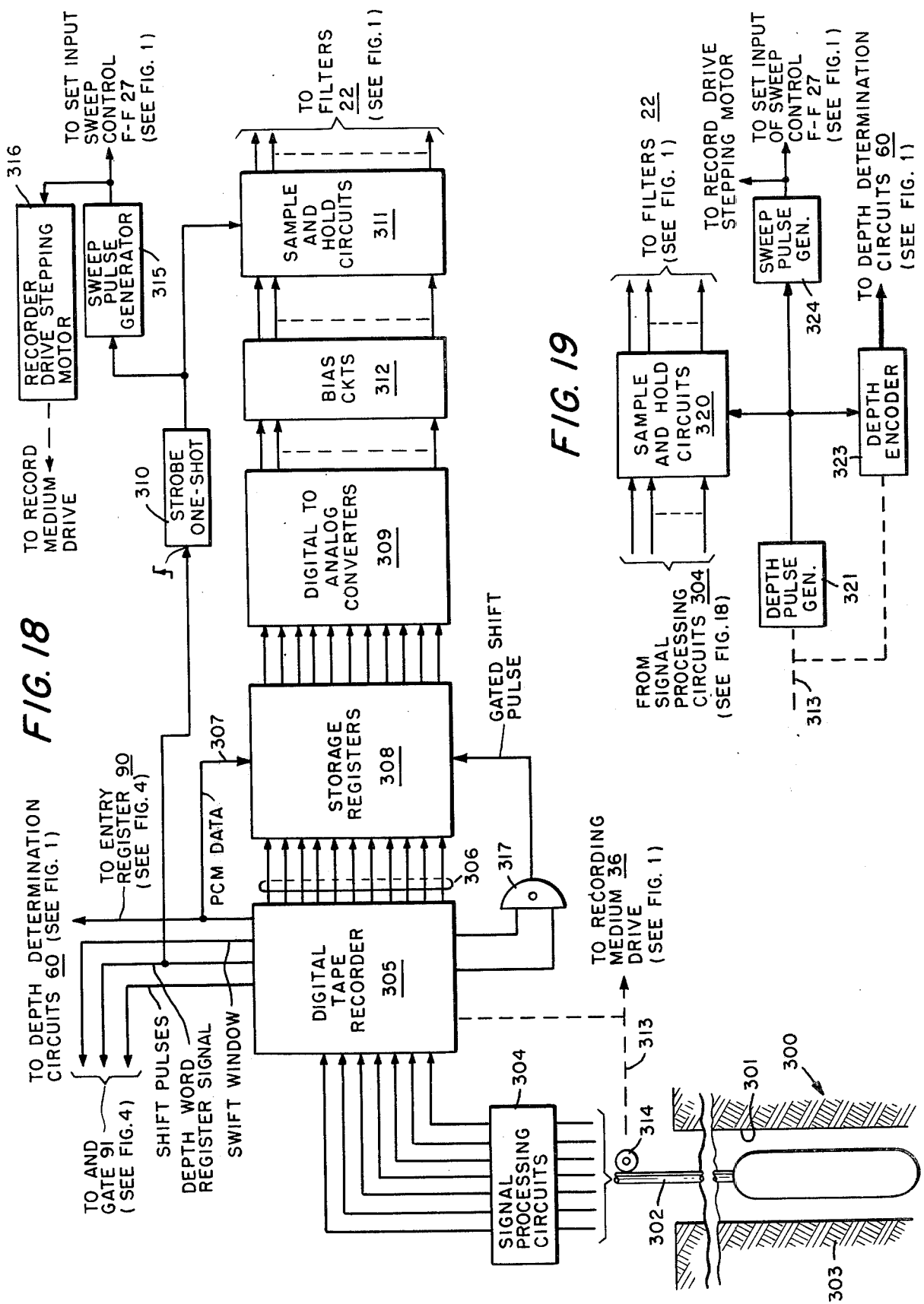

METHODS AND APPARATUS FOR RECORDING WELL LOGGING MEASUREMENTS

This is a division of application Ser. No. 15,790 filed Mar. 2, 1970, now abandoned, which was refiled on Nov. 4, 1974 as continuation application Ser. No. 520,956.

This invention relates to methods and apparatus for processing data signals, particularly well logging measurements, for recording on a recording medium as a function of the depth at which said measurements were obtained. The invention has special application to recording of well logging data with a cathode ray tube recorder.

In producing well logging measurements, a logging tool containing one or more exploring devices is lowered into a borehole drilled into the earth for measuring various properties of the subsurface earth formations adjacent to a borehole, or properties of the borehole itself. Such measurements are of considerable value in determining the presence and depth of hydrocarbon bearing zones that may exist in the subsurface earth formations.

It is desirable in many instances to provide one or more visible logs of the investigated subsurface phenomena at the well site within a relatively short time after the log has been run. In other cases, it is desirable to transmit the well logging measurements to a remote location so as to enable processing of the data by a digital computer and thereby obtain valuable computer information. Such transmission can be undertaken while the investigating apparatus is being run through the borehole (real time) or at some later time as by recording the measurements on magnetic tape for subsequent transmission.

As is usually the case when such well logging data is transmitted to a remote location, the well logging measurements are converted into digital form for such transmission. To provide a meaningful visual record of such transmitted well logging measurements, it is necessary to produce an analog type of presentation of the well logging measurements, usually in the form of recorded traces whose positions on a recording medium are representative of the amplitudes well logging measurements versus depth.

When well logging measurements in digital form are transmitted from one location to another, it is sometimes the case that the transmitting tape includes data from two or more magnetic tapes which have been merged onto the transmitting tape. Such merging of data produces a large number of measurement channels on a single tape. (Each channel corresponds to a separate information source.) To adequately produce an analog recording of such merged data puts harsh design criteria on a recorder for recording all of this merged data in analog form. To record such merged well logging data as well as unmerged data in the past, a galvanometer type of recorder has been used. In such a galvanometer recorder a plurality of galvanometer mirrors assume an angular orientation in proportion to the amplitude of the well logging measurement to be recorded such that light reflected off the mirror onto a nearby film will assume the proper position on the film. Unfortunately, a separate galvanometer mirror is required for each and every channel of data to be recorded. While there have been usually, though not always, a sufficient number of recording channels in currently used galvanometer recorders to provide real time recording of well logging measurements (i.e., recording of the measurements as they are derived from the investigating apparatus in the borehole), such is not always the case when recording merged data because of the large number of channels to be recorded.

It is, therefore, an object of the present invention to provide new and improved methods and apparatus for recording data signals and, more particularly, for recording a large number of channels of well logging data with one recording device.

To accommodate such a large number of signal channels, a cathode ray tube recorder can be utilized for recording as many channels of data as desired. To accomplish this, the cathode ray tube beam is repetitively swept across the face of the cathode ray tube while being modulated as a function of the signals to be recorded. To accomplish this modulation, the ramp signal which causes the sweep of the beam across the face of the tube is compared with the well logging signals to be recorded and when the ramp signal amplitude equals the well logging signal amplitude, the cathode ray tube beam is unblanked to produce a mark on the film. By so doing, as many well logging signals as desired can be recorded.

If the sweep rate is maintained constant, the frequency of each well logging signal to be recorded will affect the presentation on the film. That is to say, since a mark or image is placed on the film once per sweep for each well logging signal to be recorded, the spacing between such marks will be dependent on the rate of change of the well logging signal to be recorded. Thus, if a DC signal is being recorded, the spacing between each mark will be much closer than for the case where a high frequency AC signal is being recorded. Without special provisions being made, the recorded high frequency signal will tend to look washed out when compared with the recorded DC signal.

It is, therefore, another object of the present invention to provide new and improved methods and apparatus for recording well logging signals wherein the frequency of the signals being recorded does not adversely affect the visual presentation of such signals.

When recording data from a plurality of channels on one portion of a recording medium, it is usually desirable to code one or more of the traces being recorded to enable easy identification of the recorded traces corresponding to each measurement. Such coding usually takes the form of dotting or dashing, or both, one or more of the recorded traces. However, variations in the frequency of the signals to be recorded will tend to vary the coding produced on the film. For example, if the coding takes the form of dashing the recorded trace, the length of each dash (and space between dashes) will vary as a function of the frequency of the well logging signals.

It is, therefore, another object of the present invention to provide new and improved methods and apparatus for producing a uniform coding pattern regardless of the frequency or rate of change of the signals to be recorded.

When recording a plurality of well logging measurements on one portion of a recording medium, the interval between certain ones of the recorded traces is often indicative of certain subsurface characteristics. An example of this can be found in U.S. Pat. No. 3,166,708 granted to M. L. Millican on Jan. 19, 1965. When recording a plurality of well logging measurements on one portion of a recording medium, it becomes difficult to visually identify the areas between selected ones of the recorded traces on the recording medium. This is especially true when the recorded traces crisscross back and forth.

It is, therefore, another object of the present invention to provide new and improved methods and apparatus for selectively coding the areas between recorded traces on a recording medium to provide easy identification of certain subsurface characteristics.

Many times, a particular formation parameter can be identified by the area between two recorded traces only when the trace corresponding to one well logging measurement is on a particular side of the other trace, i.e., one signal amplitude is greater than the other. In this case, when the two traces crisscross, the relationship of the two recorded traces to one another will no longer be meaningful relative to the particular formation parameter.

It is another object of the present invention, therefore, to provide new and improved methods and apparatus for recording well logging data in such a manner that the area between selected traces can be readily identified.

Along with recording the well logging measurements, it is desirable to provide visual indications on the recording medium of the depth levels from which the well logging measurement were obtained. When such well logging measurements are in digital form, the depth data is usually also in digital form thus requiring some processing of the digital depth data to enable depth numbers to be periodically recorded on the recording medium.

It is, therefore, another object of the present invention to provide new and improved methods and apparatus for processing digital depth data for recording on a recording medium.

While these recorded depth numbers provide easy identification of the absolute depth of the logs, it would be undesirable to record such depth numbers at frequent intervals. Such frequent recording of these depth numbers would undesirably clutter the log. However, it would be desirable to be able to identify the depth of these logs at more frequent intervals than would be provided by a relatively infrequent recording of the depth numbers. This can be accomplished by recording depth lines at selected intervals. In this connection, it would be desirable to provide readily identifiable indications on the recording medium of selected increments of depth.

It is, therefore, still another object of the present invention to provide new and improved methods and apparatus for recording depth lines in a manner to provide easy identification of different depth increments.

When using a cathode ray tube for recording purposes, it would be desirable to monitor the beam current of the cathode ray tube and maintain this current at a relatively constant level so as to produce a relatively constant exposure on the film. However, since the beam is being modulated, i.e., unblanked at unpredictable positions of its sweep across the face of the CRT, it is difficult to know just when to measure the beam current.

It is, therefore, yet another object of the present invention to provide new and improved methods and apparatus for measuring the beam current of a cathode ray tube for purposes of maintaining a relatively constant film exposure.

When recording well logging data, a recording mechanism exposes selected portions of a film in accordance with the information to be recorded. The exposed film must then be developed, and dried, before one is able to inspect the log. It would, however, be desirable to be able to inspect the log at the same time the film is being exposed, which is an impossibility with present recording devices.

It is, therefore, still another object of the present invention to provide new and improved methods and apparatus which enable immediate inspection of the data being recorded.

In accordance with the recording methods and apparatus of the present invention, well logging signals, either in analog or digital form, are derived from either an exploring device in a borehole or from digital processing equipment such as a digital tape recorder or telemetry equipment for application to the recorder of the present invention. In a desirable form, this recording equipment comprises a cathode ray tube recorder which, in response to a digitally generated sweep signal, repetitively sweeps a beam across a recording medium which is moved past this face at a rate dependent on the depth at which the signals to be recorded were derived.

The well logging signals are processed and then used to modulate the beam intensity.

To produce a constant density trace on the record medium in accordance with a feature of the invention, the length of the trace recorded on the record medium for each sweep of the beam is varied as a function of the rate of change of the well logging signal. This is accomplished by comparing the sweep signal (whose amplitude is representative of the position of the beam on the record medium) with delayed and undelayed versions of the well logging signal and generating a writing signal whose pulse width is representative of the rate of change of the well logging signal. This writing signal can be used to modulate the beam.

The recorded data can be coded to distinguish the recorded signals (called logs) from one another (called line coding) and to distinguish areas between logs from one another (called area coding). Line coding is accomplished by selectively inhibiting at least one portion of a writing signal in dependence on the rate of change of the well logging signal to be recorded. Area coding is accomplished by generating a coding pattern signal and modulating the beam with this pattern signal to thereby produce the pattern on the record medium. Conditional coding is accomplished by modulating the beam intensity as a function of this coding pattern signal only when two logging signals assume a predetermined relationship to one another.

The beam current of the cathode ray tube can be controlled by modulating the beam intensity with a constant amplitude signal at a predetermined time during each sweep of the beam. The beam current can then be measured at the proper time during each sweep and this measured value used to adjust the beam current to a desired level.

Depth information can be recorded in accordance with another feature of the invention. This can be accomplished by writing each digit or a depth number in side by side positions on record medium and/or by writing a prescribed number of lines on the record medium for given incremental change in depth. Digital commonly used in controlling the horizontal sweep and focus of the electron beam of a cathode ray tube, and are included in this application for illustration only and are not considered a part of the present invention. The purpose and operation of each of these circuits will be readily apparent to one skilled in the art and will not be discussed further. The beam is modulated by the signals from the CRT brightness control circuits 50 to record traces on a recording medium (film) 36. Desirably, the cathode ray tube 25 is of the fiber optic type in that it has a fiber optic face plate for bringing about superior resolution of the "spot" (beam striking the face) on the recording medium 36.

The recording medium 36 is moved past the face of the tube 25 at a constant rate by a constant speed motor 33 which moves the film at a rate determined by the transmission rate of telemetry equipment 20. If desired, the motor 33 could be synchronized by the telemetry equipment 20.

Before proceeding with a detailed discussion of how the writing signals are processed for application to a CRT recorder, it would first be desirable to discuss the operation of the sweep circuit 24 portion of the present invention in detail. This sweep circuit 24 operates to periodically generate pulses at a fixed frequency, count these pulses, and produce a sweep signal for application to a cathode ray tube and provide discrete digital signals for use by other circuits in the FIG. 1 system.

Referring now to FIG. 1A, a pulse generator circuit 26 utilizes the 60 Hertz power line for generating pulses having a frequency of 120 Hertz. (See FIG. 2A.) The generator 26 can take the form of an overdriven amplifier, clipping circuit, and monostable multivibrator operating in conjunction to generate a pulse for each zero crossing of the 60 Hertz signal. Each pulse produced by the generator 26 sets a sweep control flip-flop 27 which, when set, enables an AND gate 28 to pass high frequency pulses generated by a high frequency clock 29. (See FIGS. 2B and 2C.) The pulses from the AND gate 28 designated CL, are divided by two by a flip-flop 30 and applied to the count input of a binary counter 31. As will be seen later, the numerical state of the binary counter 31 corresponds to the position of the beam on the face of a cathode ray tube.

The binary counter 31 output is applied to a binary to analog converter 32 which produces an analog voltage whose magnitude increases in accordance with the increase of the count state of the binary counter 31. Thus, as more and more clock pulses are applied to the counter 31, the output voltage of the binary to analog converter 32 will correspondingly increase. This output signal from the converter 32 is designated the "sweep signal" and is shown in FIG. 2D. This sweep signal is applied to the modulators 23 as well as to CRT horizontal deflection circuits 34 which process the sweep signal in a manner to produce a linear sweep versus time of the cathode ray tube beam across the face thereof. Thus, the sweep signal can be referred to as a sweep position signal.

An "end of sweep matrix circuit" 35 responds to a selected numerical count of binary counter 31 to produce a reset pulse for resetting the sweep control flip-flop 27. (See FIG. 2E.) This sweep reset pulse is also applied to various other circuits in the FIG. 1 system for purposes to be described later.

The output signals from each stage of the binary counter 231 are also applied to a scale line circuit 37 which, in response to selected count sequence of the binary counter 31, generates scale line signals use for writing scale lines on the recording medium 36. To accomplish this, the output signals from binary counter 31 are applied to a scale grid card reader 38 which selects certain numerical outputs of the binary counter 31 for application to one of a pair of one-shots 39 and 40. The one-shot 39 produces pulses having a pulse width of time duration $t_1$ and one-shot 40 produces pulses having a pulse width of time duration $t_1 + t_2$. The output of one-shots 39 and 40 are combined in an OR gate 41 for application to combining and logic circuits 42. FIG. 2F shows the resulting scale grid pulses.

The combining and logic circuit 42 processes these pulses from one-shots 39 and 40 to produce scale lines on the recording medium 36. The pulse width of the pulses from one-shots 39 and 40 determine the length of the trace produced on the recording medium 36 as the beam sweeps transversely across the recording medium 36. These traces are shown in FIG. 2G. Since the recording medium is moving in a direction perpendicular to the direction of this sweep, the writing time will determine the width of the line produced on the recording medium as the beam is repetitively upset thereacross. The card reader 38 enables any scale line pattern desired to be produced by merely inserting the appropriate card therein.

The scale line circuit 37 also includes an "initial scale line one-shot" 43 which operates in response to the leading or rising edge of the sweep control signal flip-flop 27 ouput signal to generate an "initial scale line pulse" for application to the OR gate 41 and separately to the combining circuits 42, as well as to other circuits to be described later. Since, as seen in FIG. 2B, the sweep control signal rises at the initiation of the sweep signal of FIG. 2D, the one-shot 43 will operate to generate a pulse at the beginning of each sweep, which pulse is used to produce an initial scale line on the recording medium. The reason for this separate treatment of the initial scale line will be described later.

The writing signals from modulators 23 are individually applied to separate ones of a plurality of parallel line coding circuits 45 which operate to code the traces which are recorded on the recording medium 36. As will be explained in more detail later, the coding circuits 45 operate to inhibit selected portions of the writing signals to accomplish this coding operation. The coding circuits 45 also operate in response to the rate of change of the well logging signals to vary the coding operation as a function of this rate of change to enable uniform line coding regardless of the rate of change of the well logging signals. To allow selection of the particular type of coding to be applied to the signals for each channel, the line coding card reader 46 instructs the line coding circuits 45 to apply selected codes to signals from the different channels.

The writing signals from modulator 23 are also applied to an area coding card reader 47 which selects individual ones of the writing signals from modulators 23 for application to individual coding circuits of the area coding circuits 48. The area coding circuits 48 include a plurality of pattern generators which operate to individually produce any one of twelve patterns on the recording medium 36. Examples of these patterns are shown in FIGS. 15A–15L. These patterns can indicate such subsurface constituents as oil, gas, sand, porosity, water, limestone, etc.

As discussed earlier, it is usually the case that the area between two recorded traces indicates the amount depth data from suitable digital processing equipment can be used for these purposes.

In accordance with still another feature of the invention, the well logging signals are displayed a depth section at a time. To accomplish this, a CRT beam is swept in one direction as a function of depth while it is at the same time repetitively swept in a transverse direction thereto. The beam is modulated with representations of the well logging signals.

For a better understanding of the present invention, together with other and further objects thereof, reference is had to the following description taken in connection with the accompanying drawings, the scope of the invention being pointed out in the appended claims.

Referring to the drawings:

FIG. 1A shows a portion of the FIG. 1 system in greater detail;

FIGS. 2A-2G are waveform diagrams useful in explaining certain features of the FIG. 1 system;

FIG. 3 illustrates an example of a recording medium on which scale lines have been recorded when utilizing the FIG. 1 system;

Figure 1:
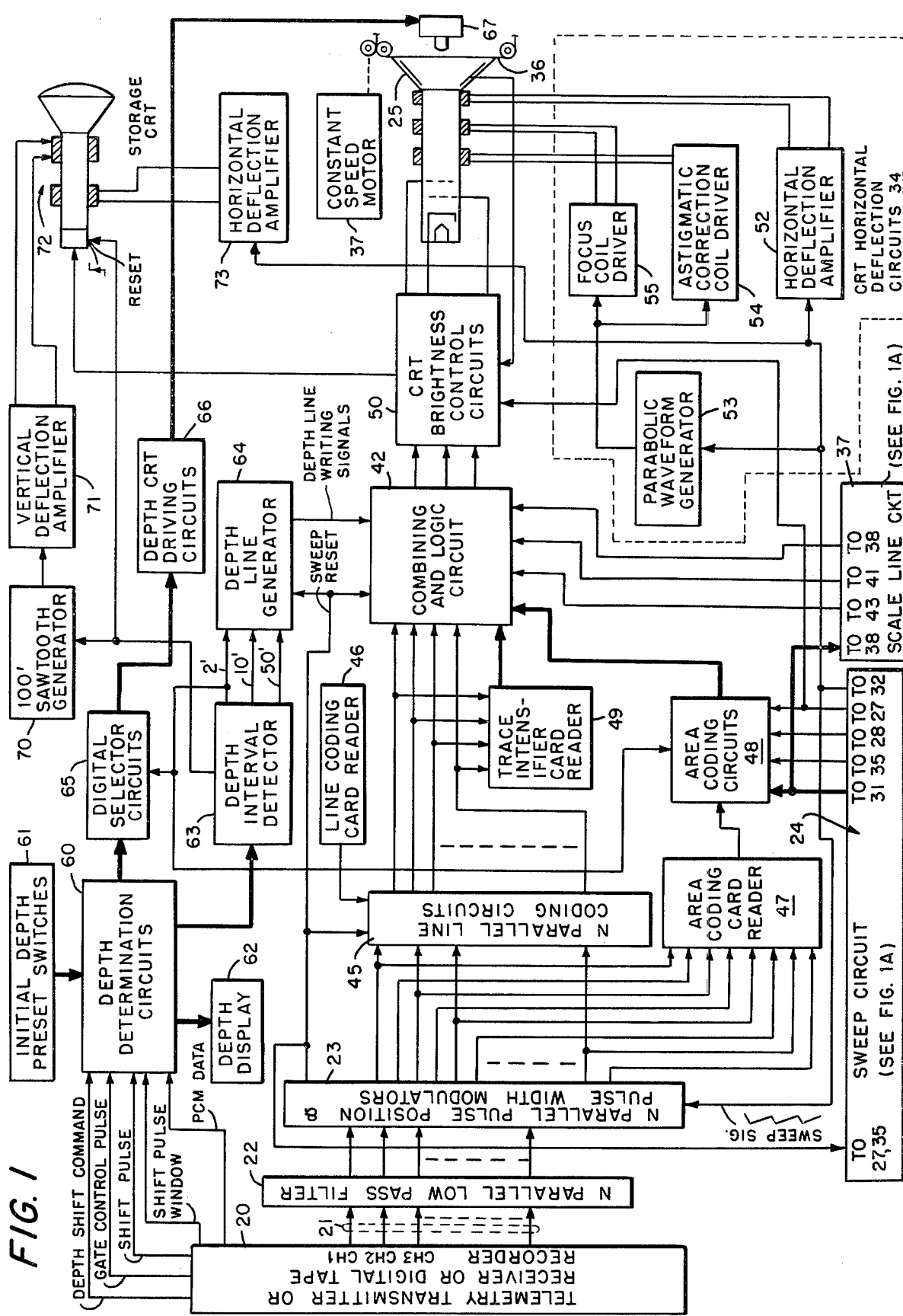
FIG. 1 is a block diagram representation of one embodiment of well logging data recording apparatus constructed in accordance with the present invention.
Figure 4A:
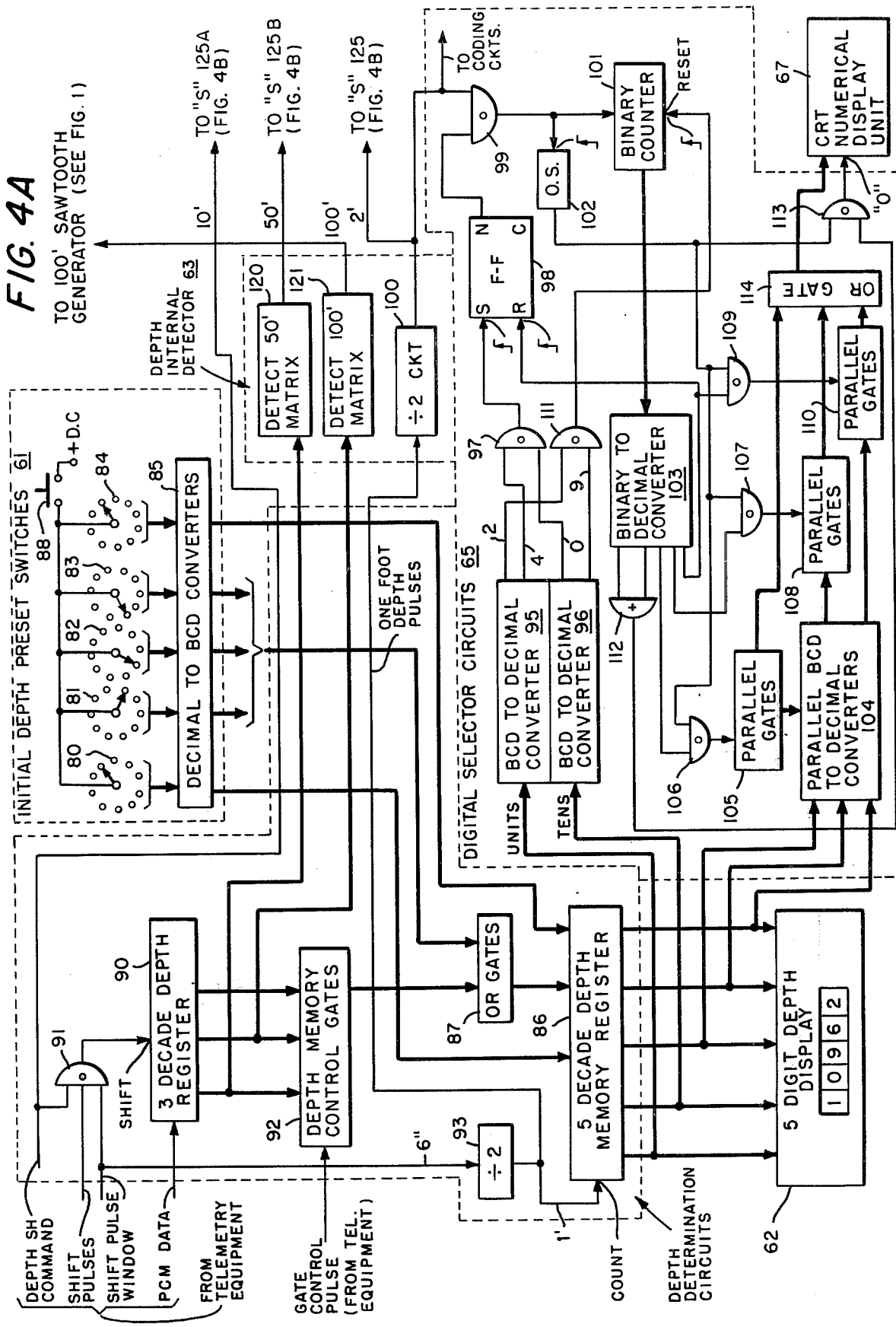
FIGS. 4A and 4B show certain portions of the FIG. 1 system in greater detail and will hereinafter be referred to simply as FIG. 4.
Figure 4B:
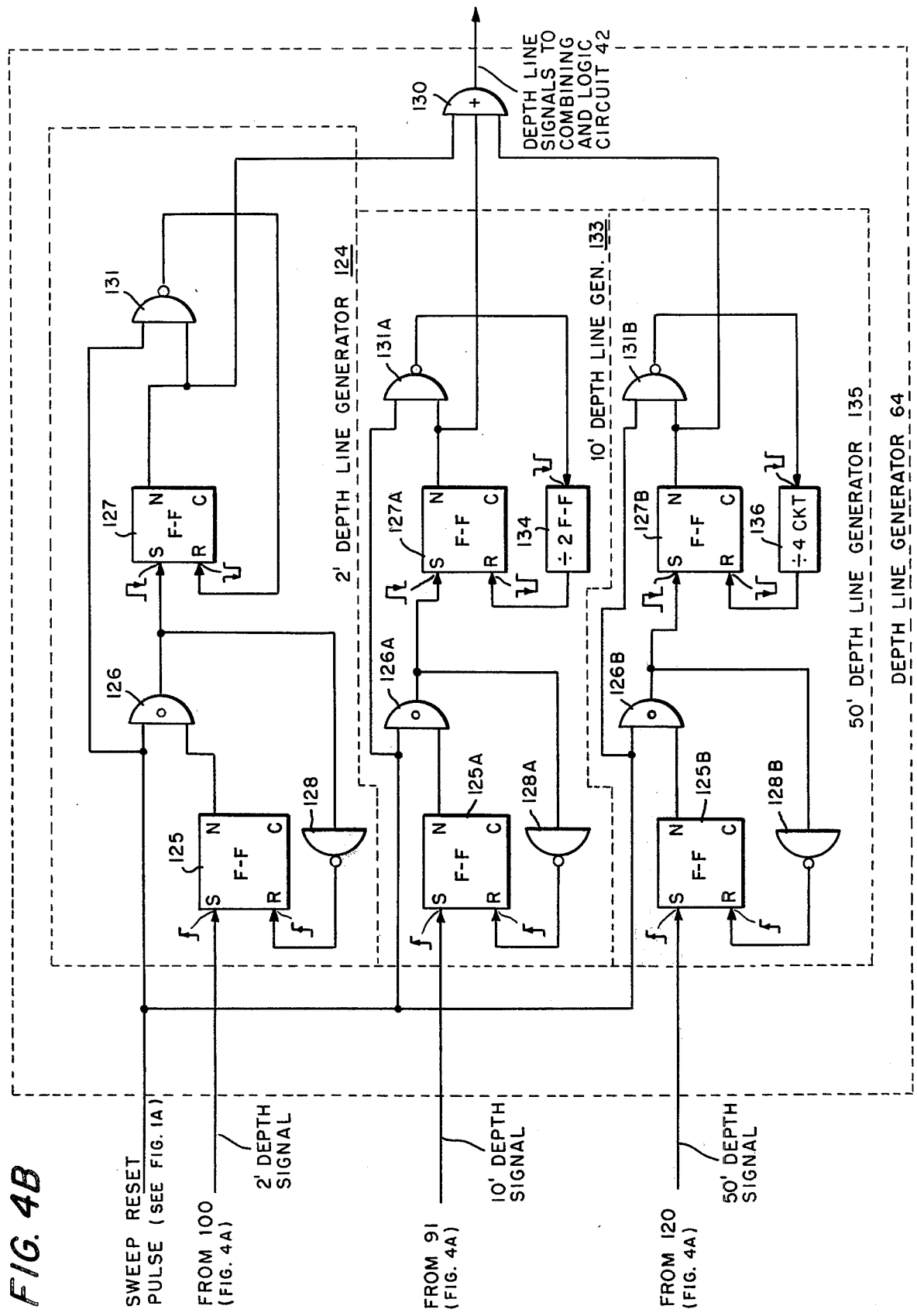
Figure 14A:
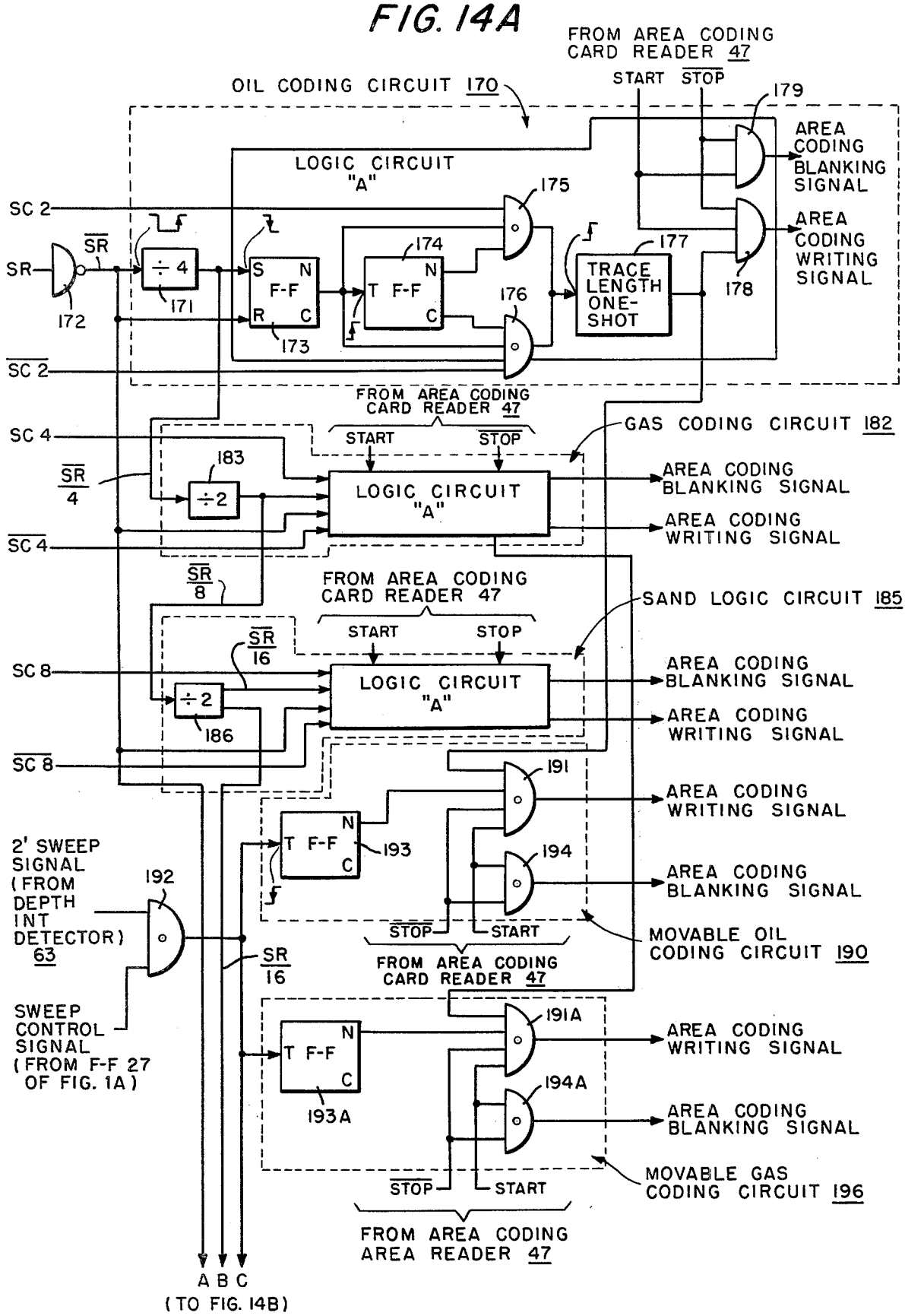
Figure 14C:
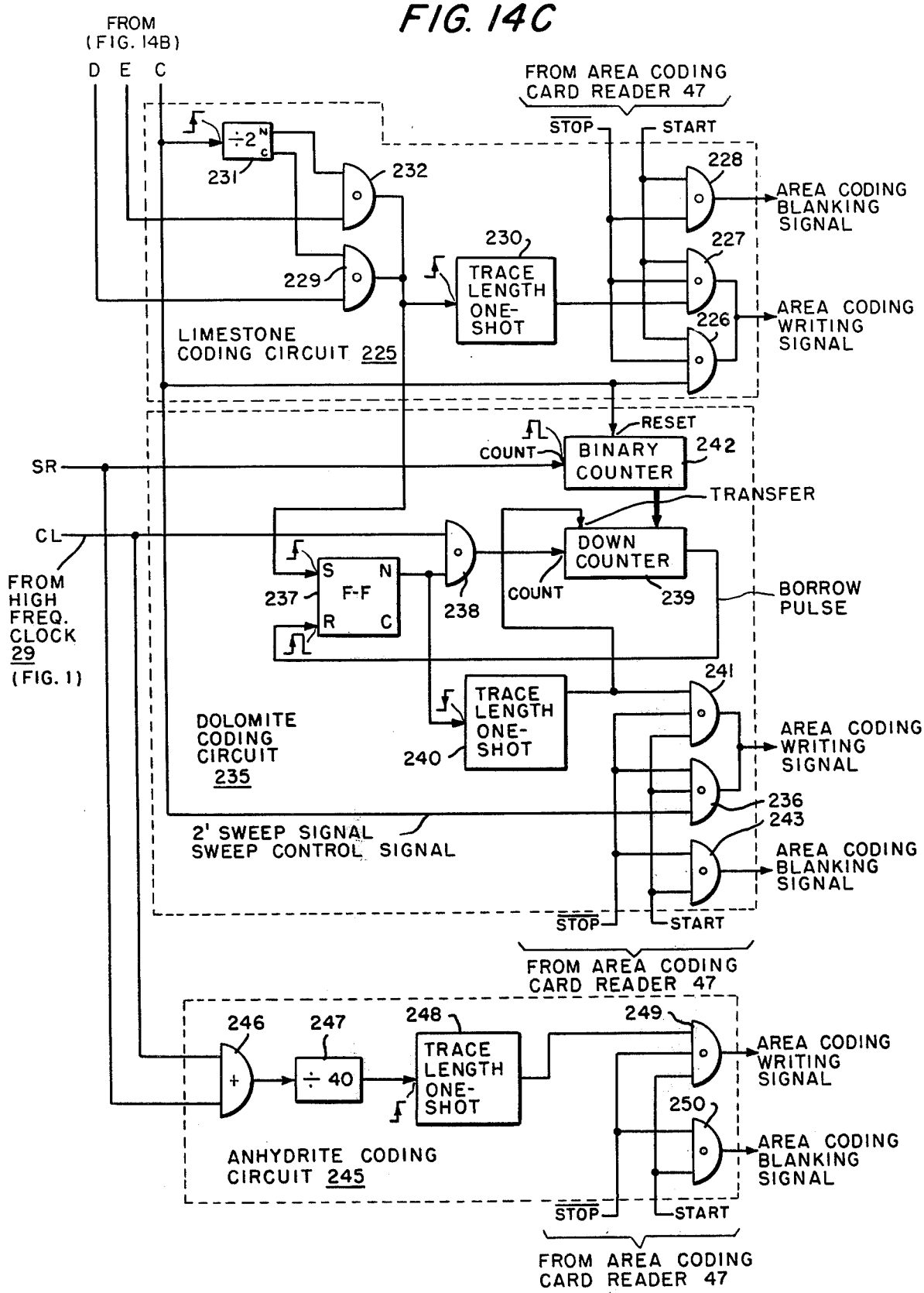

FIGS. 5A-5K, 6A-6F, and 7A-7F are waveform diagrams useful in explaining the operation of the circuitry of FIG. 4;

FIG. 8 is an example of a recording medium on which depth lines have been recorded through utilization of the FIG. 4 circuitry;

FIG. 9 is an example of a recording medium on which both scale lines and depth lines have been recorded;

FIG. 10 illustrates a portion of the FIG. 1 system in greater detail;

FIGS. 11A-11E are waveform diagrams useful in explaining the operation of circuitry of FIG. 10;

FIG. 12 is an example of a log or record produced when utilizing the apparatus of FIG. 10;

FIG. 13 is a more detailed representation of still another portion of the FIG. 1 system;

FIGS. 14A, 14B and 14C show a more detailed representation of still another portion of the FIG. 1 system and will be hereinafter referred to simply as FIG. 14.

Figure 17B:
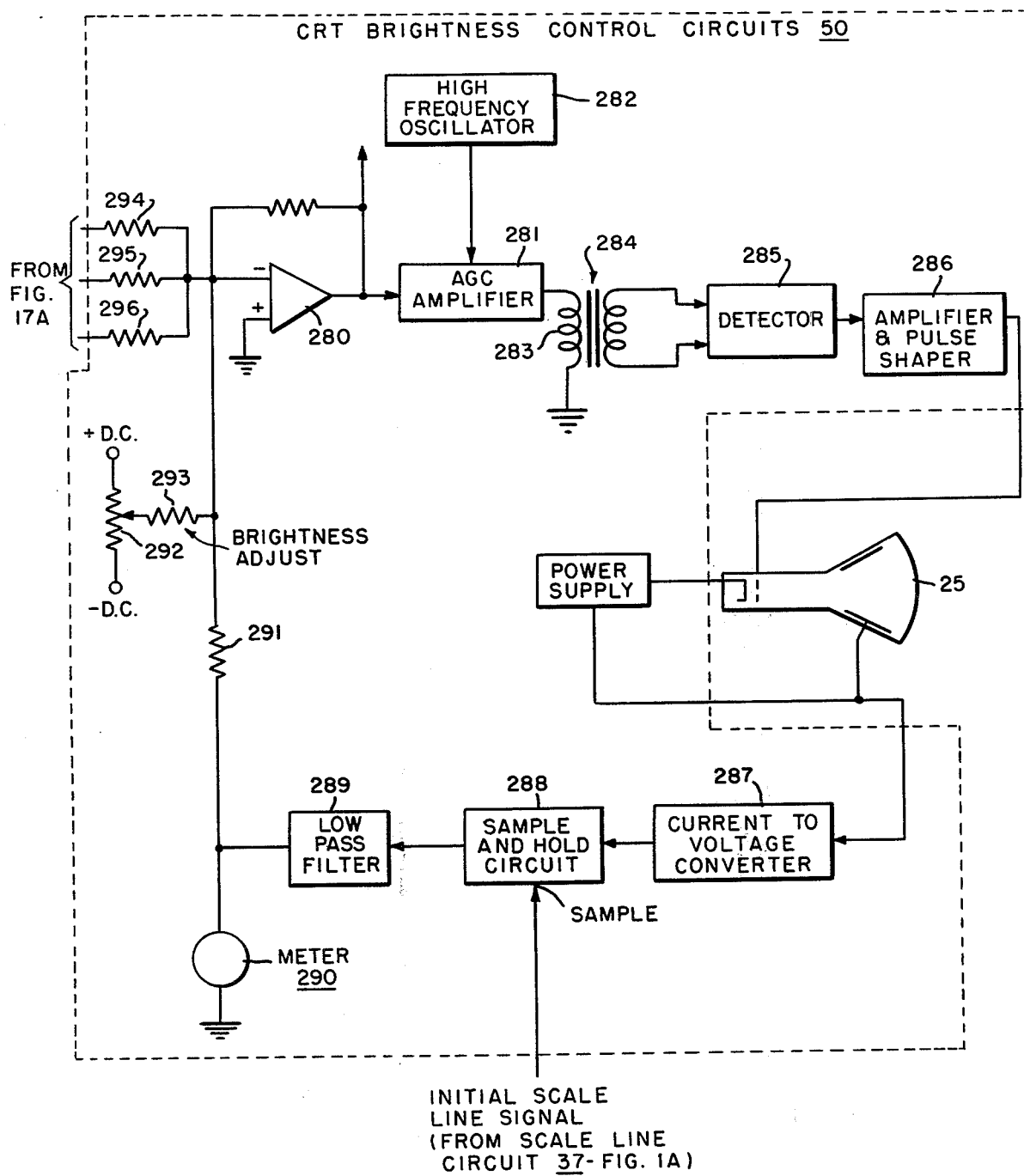

FIGS. 15A-15L illustrate examples of recordings produced through utilization of the apparatus of FIG. 14;

FIGS. 16A-16G illustrate waveform diagrams useful in explaining the operation of the apparatus of FIG. 14;

FIGS. 17A and 17B show still other portions of the FIG. 1 system in greater detail and will be hereinafter referred to as FIG. 17;

FIG. 18 shows a well tool in a borehole along with recording apparatus constructed in accordance with the present invention; and FIG. 19 shows still another embodiment of recording apparatus constructed in accordance with the present invention.

Now referring to FIG. 1, a digital information source 20 produces output signals which are utilized by the recording apparatus of the present invention to provide recordings of such signals. This information source 20 can take the form of a digital telemetry transmitter receiver such as the system shown in U.S. Pat. No. 3,599,156 by Miller et al,. For present purposes, it will be assumed that the information source 20 takes the form of the digital telemetry system shown in U.S. Pat. No. 3,599,156.

The telemetry system described in this Miller et al patent is a tape-to-tape synchronous digital transmission system wherein data read from a tape at one remote location is transmitted in serial form to a telemetry receiver at another remote location and writted on tape at that remote location. At both the transmitting and receiving locations, the telemetry equipment includes playback circuits which convert the serial digital data to analog output signals which are representative of the digital data. Additionally, this telemetry equipment includes provisions for playing back a tape without transmission to convert the digital data on tape to parallel analog signals. These parallel analog signals are outputed from the telemetry equipment on the conductors 21. The channels 1, 2, 3 .... n designations on individual ones of these conductors indicates the channel numbers of the data being outputed from the telemetry equipment 20. Each channel corresponds to a different information source or well logging measurement. The outputed data can correspond to transmitted or received data or it can take the form of data played back from a tape without a simultaneous transmission.

These outputed well logging measurements are applied to a plurality of parallel low pass fibers 22 which operate to filter out any transients caused by the commutating operation within the telemetry equipment 20. The filtered well logging signals are then applied to a plurality of parallel pulse positions and pulse width modulators 23 which individually operate to produce writing signals for application to subsequent circuits for further processing.

These individual modulators operate to compare a sawtooth sweep signal from a sweep circuit 24 with the individual well logging signals and produce writing signals when the amplitudes of the two compared signals are substantially equal. In producing these writing signals, the individual modulators operate to compensate for variations in the frequency or rate of change of the individual well logging signals. How this is accomplished will be described in detail later.

The modulated signals are then applied to "parallel line coding circuits" 45 where they are selectively coded so that, when recorded on film or the like, the recorded traces for each channel can be readily identified. The modulated signals are also applied to area coding circuits 48 via an area coding card reader 47. The area coding circuits 48 operate to generate area coding patterns which are recorded between selected traces on the recording medium (e.g., film). The area coding card reader 47 selects the patterns and the signal channels for this coding operation. Both the line and area coded signals are combined in a "combining and logic circuit" 42, as are other signals to be discussed later. The combined signals are applied to a "CRT brightness control circuit" 50 for application to the brightness control grids of the cathode ray tube 25.

The sweep signal generated by the sweep circuit 24 is applied via a "CRT horizontal deflection circuit" 34 to the horizontal sweep coils of the tube 25 for repetitively sweeping the beam across the face of tube 25. Circuitry shown in FIG. 1 which comprises "CRT Horizontal Deflection circuits" 34 include "Horizontal Deflection Amplifier" 52, "Parabolic Waveform Generator" 53, "Astigmatic Correction Coil Driver" 54, and "Focus Coil Driver" 55. Circuits such as these are cuits 60 so that depth numbers will be printed on the recording medium 36 when the last two digits of the depth numbers are 96, 98, 00, 02, and 04. Thus, for example, a digit of a depth number will be recorded at each of 2196 ft., 2198 ft., 2200 ft., 2202 ft., and 2204 ft. By so doing, the depth number will appear sideways on the record medium to minimize the width of the depth track.

The hundred foot depth interval signals from the depth interval detector 63 are applied to a sawtooth generator 70 which operates to generate a timing signal having a time period corresponding to 100 feet of data generated from the telemetry equipment 20. This 100 ft. sawtooth signal is applied to a vertical deflection amplifier 71 which drives the vertical deflection coil of a storage cathode ray tube 72. The horizontal sweep signal from the sweep circuit 24 is utilized to energize the horizontal sweep coil of the storage cathode ray tube 72 via a horizontal deflection amplifier 73. The CRT brightness control circuits 50 supply the combined writing signals to the storage cathode ray tube 72 to modulate the beam intensity thereof.

By this arrangement, in accordance with another feature of the present invention, the storage cathode ray tube 72 will provide a visual display of up to 100 feet of recorded data to thereby enable one to visually determine what data has been recorded on the recording medium 36. The phosphor of the storage CRT 72 is erased at the end of each 100 ft. interval.

Now turning to FIG. 4, there is shown the depth determination circuits, initial depth preset switches, digit selector circuits, depth interval detector and depth line generator of FIG. 1 in greater detail. First, concerning the initial depth preset switches 61, five decade switches 80, 81, 82, 83 and 84 are set in accordance with the initial depth of the data which is being transmitted or received by the telemetry equipment 20. The decade switch 80 corresponds to units of feet, the decade switch 81 to tens of feet, switch 82 to hundreds of feet, switch 83 to thousands of feet, and the switch 84 to tens of thousands of feet. The ten contacts of each decade switch are connected to individual decimal to binary coded decimal converters 85 which operate to convert the decimal number from each decade switch to a binary coded decimal number.

The binary coded decimal numbers corresponding to the tens, hundreds, and thousands foot switches are applied to the tens, hundreds and thousands foot positions of a five decade depth memory register 86 via OR gates 87. The units and tens of thousands foot binary coded decimal numbers are applied directly to the corresponding portions of the register 86.

To set the initial depth number into the register 86, a switch 88 is momentarily depressed so as to apply a DC voltage to the wiper arms of the five decade switches 80-84. Once the switch 88 is depressed, the memory register 86 will have stored therein the initial depth of the measurements to be received from the telemetry equipment 20.

The depth memory register 86 is then continually updated as data is transmitted, received or played back by the telemetry equipment 20. To accomplish this, the pulse code modulated data from the telemetry equipment 20 is entered into a three-decade shift register 90. As discussed in U.S. Pat. No. 3,599,156 by, depth words are transmitted every ten feet. Thus, whenever a depth word is entered into the depth register 90, it can be assumed that the lowest order digit will always be zero.

Since the PCM data conductor from telemetry equipment 20 has data therein continuously, the depth entry register 90 is activated only when a depth word is being transmitted or received. To accomplish this, the shift pulses and shift pulse window (which corresponds in time to the generation of the shift pulses) and the depth shift command pulse from the telemetry equipment 20 are combined in an AND gate 91. the resulting gated shift pulses from AND gate 91 are utilized to shift the contents of the depth register 90 only when depth words are being transmitted, received, or played back. By this means, only depth words will be entered into the depth register 90.

After depth has been entered into the register 90, a plurality of depth memory control gates 92 are energized by the gate control pulse from the telemetry equipment 20 to transfer the data in the depth register 90 to the tens, hundreds, and thousands foot portions of the depth memory register 86 via the OR gates 87. Thus, the tens, hundreds and thousands portion of the memory register 86 will be continuously updated while data is processed by the telemetry equipment 20.

To update the units foot portion of the depth memory register 86, the shift pulse window pulses from the telemetry equipment 20 are divided by two by a flip-flop 93 and then applied to the count input of the unit foot position of the register 86. As discussed in U.S. Pat. No. 3,599,156 by Miller et al, the shift pulse window pulses are generated once per 6 inches of depth. Thus, the units foot portion of the depth memory register 86 will be updated at one foot intervals. The register 86 counts down to correspond with the telemetry operation. (Boreholes are logged from bottom to top and thus the actual depth footage decreases).

The contents of the depth memory register 86 are applied in parallel fashion to the depth display unit 62 such that a visual numerical display of the depth of the data being transmitted, received or played back by the telemetry equipment 20 can be obtained at all times. The contents of the depth memory register 86 are also applied to the digit selector circuits 65, which as discussed earlier, operate to select those depth numbers whose last two digits are 96, 98, 00, 02, and 04 for application to the cathode ray tube numerical display device 67.

To accomplish this, the binary coded decimal output signals from the units and tens decade units of the depth memory register 86 are applied to a pair of binary coded decimal to decimal converters 95 and 96 respectively. The count sequences for the combination of converters 95 and 96 are shown in FIG. 5A. An AND gate 97 is responsive to the zero digit of the converter 96 and the No. 4 digit of the converter 95 for producing the pulse of FIG. 5B for setting a flip-flop 98. When set, the flip-flop 98, whose normal output is shown in FIG. 5C, enables an AND gate 99 to pass a two foot depth signal from the depth interval detectors 63. The gated two foot depth signal is shown in FIG. 5D. (This two foot depth signal is obtained by dividing the one foot depth signal from the flip-flop 93 by two with a divide by two flip-flop 100 within the depth interval detector 63.) Every two feet the leading edge of the gated two foot signal from AND gate 99 advances a binary counter 101 and energizes a one shot 102. The binary counter 101 count sequences are of a particular subsurface constituent only when one of the traces is on one or the other side of the other trace on the recording medium. To enable the area coding circuits 48 to generate patterns only under the proper conditions, the area coding card reader 47 causes the card reader 47 to select certain ones of the writing signals as "start" signals and certain ones as "stop" signals. The start signals will signal the circuits 48 to begin producing the area coding pattern and the stop signals will cause the pattern to terminate. If the selected start-stop signals are reversed, no pattern will be produced.

Additionally, the line coded writing signals are applied to a "trace intensifier card reader" 49 which, in response to a selected card placed therein, selects certain ones of the line coded writing signals for application to a special input channel of the combining and logic circuit 42. The circuit 42 operates to boost the amplitude of these selected signals to thereby intensify the recorded trace for just these signals. The combining circuits 42, among other things, combines all of the line coded and area coded signals and separately combines the trace intensified signals for all channels for application to the CRT brightness control circuits 50. The combining circuits 42, in addition to combining these signals, also includes suitable logic circuits which operate to give preferential treatment to certain ones of the writing signals applied thereto for purposes to be explained later.

The CRT brightness control circuits operate to combine the line and area coded writing signals, the trace intensified signals and scale line signals (as well as depth line signals - to be discussed later) and produce signals for modulating a grid of the cathode ray tube 25. The brightness control circuits 50 also operate to monitor and control the beam current produced by the cathode ray tube 25. As discussed earlier, the cathode ray tube is modulated by the writing signals produced from well logging measurements at random time intervals, thus making it very difficult to properly monitor the beam current for control purposes. To circumvent this problem, in accordance with an important feature of the present invention, the initial scale line pulse from scale line circuit 37 (FIG. 1A) causes the cathode ray tube beam to be unblanked a specific amount and at a specified time period during each sweep. This specified time is the beginning of each sweep. To this end, the initial scale line pulse from the scale line circuit 37 is applied to the CRT brightness control circuits 50 to inform the circuits as to the time when the initial scale line is being written. As will be explained in greater detail later, the CRT brightness control circuits 50 operate in response to this initial scale line pulse to sample the beam current and appropriately adjust it, if necessary. By so doing, the beam current will be maintained at the desired level.

The system of FIG. 1 also operates in accordance with other features of the present invention to record depth information, e.g., depth lines and depth numbers on the recording medium 36. To accomplish this, the initial depth at which well logging measurements are derived is set into depth determination circuits 60 by a plurality of initial depth preset switches 61. Data from the telemetry transmitter or receiver is thereafter utilized to continuously update the depth determination circuits 60. The depth determination circuits 60 continually provides data for a depth display unit 62 so that a numerical representation of the depth of the well logging signals outputed from the telemetry transmitter or receiver 20 can be viewed at all times.

To update the depth determination circuit 60, pulse code modulated data from the telemetry unit 20 is applied to the depth determination circuit 60 for entry into an appropriate register. The telemetry equipment 20 also supplies shift pulses and a shift pulse window to the depth determination 60 to enable the pulse code modulation data to be shifted into the register at only the time period when a depth word is being transmitted or received. The shift pulses are applied to this entry register under control of the shift pulse window, the shift pulse window acting to insure that only the necessary number of shift pulses are actually applied to this entry register. The telemetry equipment 20 causes a depth shift command pulse to be applied to the depth determination circuits 60 to insure that only depth words are entered into this entry register. The depth data in this entry register is then shifted to another register by a gate control pulse from the telemetry equipment 20 after the depth word has been entered into this entry register. How the depth determination circuits 60 utilize these signals from the telemetry equipment 20 will be described in detail later.

As mentioned earlier, the telemetry equipment 20 is described in U.S. Pat. No. 3,599,156 by Miller et al. In this patent, the pulse code modulated data is derived from the wiper arm of a four position switch 70A in FIG. 15C of that patent. The shift pulses are derived from the output of an AND gate 205 in FIG. 15A of the Miller et al patent and are designated "shift 14" therein. The shift pulse window is derived from a one-shot 187 in FIG. 15A of the Miller et al patent and is designated "tape write and depth display window" therein. The depth shift command pulse is derived from the wiper arm of a four position switch 70E in FIG. 15A of the Miller et al patent and is designated "command shift depth display" therein. The gate control pulse is derived from a one-shot 188 in FIG. 15A of the Miller et al patent and is designated $X_4$ therein.

It is to be understood that the telemetry apparatus for producing these above-described signals does not comprise part of the present invention. Furthermore, it is to be understood that any information source could be utilized as the input to the recording apparatus of the present invention and the invention is thus not limited to recording data from the telemetry equipment described in the Miller et al patent.

The depth determination circuits 60 supply data to a depth interval detector 63 which operates to generate signals representative of 2', 10', 50' and 100' depth intervals. The 2', 10' and 50' depth interval signals are applied to a "depth line generator" 64 which operates to generate "depth line writing signals" for application to the combining and logic circuits 42 for subsequent recording. The depth line generator 64 operates to generate one line for every 2 foot depth interval, two lines for every 10 foot interval and four lines for every 50 foot interval. The depth determination circuit 60 also supplies data to a "digit selector circuit" 65 which processes the depth data and causes a numerical display of the depth number by energizing a cathode ray tube numerical display unit 67 via a "depth driving CRT circuit. 66. The display unit 67 is positioned relative to the recording medium 36 so as to record numerical representations of the depth numbers on the recording medium 36. The digit selector circuits 65 process the depth data from the depth determination cirof FIG. 1 to enable the hundred foot depth sweep for the storage cathode ray tube 72.

The depth line generator 64 operates in response to the 2, 10, and 50 foot depth signals from the depth interval detector 63 to generate signals which causes a line to be written on the recording medium every two feet, two lines to be written every 10 feet, and four lines to be written every 50 feet. To accomplish this, referring to FIGS. 4 and 6A–6F in conjunction, and first concerning the 2 foot depth line generator 124 (FIG. 4B), the leading edges of the two foot depth signals, shown in FIG. 6A, set a flip-flop 125 which, when set, enables an AND gate 126. The normal output of flip-flop 125 is shown in FIG. 6C. When enabled, the AND gate 126 passes the sweep reset pulses, shown in FIG. 6B, to the set input of a flip-flop 127. The resulting gates sweep reset pulses are shown in FIG. 6D. The flip-flop 127 is set on the trailing or falling edge of each gated sweep reset pulse of FIG. 6D. The trailing edge of each sweep reset pulse also resets the flip-flop 125 via a NAND gate 128 which inverts the output pulses from AND gate 126 to enable the pulse rising edges to reset flip-flop 125.

The normal output of flip-flop 127, shown in FIG. 6E, is applied to an OR gate 130. The output signals from OR gate 130 constitute the depth line signals which are applied to combining and logic circuit 42 for eventually causing one line to be swept transversely across the recording medium 36 every 2 feet. To insure that only one depth line is printed every 2 feet, the normal output of the flip-flop 127 enables NAND gate 131 to pass the sweep reset pulses to the reset input of the flip-flop 127 after one sweep of a depth line has been completed. The output signals from NAND gate 131 is shown in FIG. 6F.

To generate two such depth lines every ten feet is the function of the ten foot depth line generator 133 of the depth line generator circuitry 64. The 10 foot depth line generator 133 operates in an identical fashion as the two foot depth line generator 124 except that a divide by two flip-flop 134 prevents the control flip-flop corresponding to flip-flop 127 of the two foot circuit 124 from being reset until two sweeps have been completed and the two depth line sweeps are initiated by the ten foot signal from depth interval detector 63. Thus, during the time that it takes the cathode ray tube 25 to complete two sweeps, the output of the OR gate 130 is maintained at the "one" level by the ten foot line generator 133 to thereby produce two depth lines on the record medium every 10 feet.

To generate four depth lines every 50 feet, a 50 foot depth line generator 135 responds to the 50 foot depth pulses from the depth interval detector 63. The 50 foot depth line generator 135 operates in an identical fashion with the 2 foot and 10 foot depth line generators 124 and 133 except that a divide by four circuit 136 prevents the system from resetting itself until four sweeps have been completed. These elements in the 10 foot and 50 depth line generators 133 and 135 which are identical in operation with elements in the two foot depth line generator 124 are designated the same except for the addition of a letter B after the numbers for the ten foot depth line generator 133 and the addition of a letter B for the fifty foot depth line generator 135.

FIG. 8 is an example of a recording medium with the depth lines printed thereon through utilization of the depth line generator circuit 64. In FIG. 8 it can be seen that the depth lines at 10 foot intervals are wider than the depth lines at 2 foot intervals and that depth lines at 50 foot intervals are wider and thus more outstanding in appearance than either the 2 foot or 10 foot interval depth lines.

Now, turning to FIG. 9, there is shown a recording medium on which both depth and scale lines have been printed, as well as the depth numbers. In addition to the distinguishing features of the 2, 10 and 50 foot depth lines, it can be seen that one of the scale lines per track is darker than the rest. This is accomplished by inserting the desired card into the scale grid card reader 38 of FIG. 1. The depth track is shown in FIG. 9 as being located between tracks 1 and 2 and devoid of any printing other than the depth number. To accomplish this, the scale grid card reader generates a signal designated "Depth Track Inhibit" (the ‾‾‾ means "Not Depth Track Inhibit") which is utilized by the combining and logic circuit 42 to inhibit scale and depth lines from being printed in the depth track (see FIG. 1).

A depth number 11300 is printed in the depth track. It can be seen that there is one digit of this number printed every 2 feet for a 10 foot interval. At 1304 and 1302 feet "zeros" are printed and at 1300, 1298 and 1296 feet the digits 311 are printed such that when examining the recording medium, it is evident that the heavy depth corresponds to a depth of 11300 feet.

As discussed earlier, a trace is recorded on the recording medium 36 by periodically sweeping the cathode ray tube beam transversely across the recording medium and unblanking this beam at the proper time. If the well logging signal to be recorded has a slow rate of change, the marks will be placed on a recording medium in relatively closely spaced apart positions. If the signal to be recorded has a fast rate of change, these marks will be placed on a recording medium at relatively widely spaced apart positions. This difference is undesirable since it presents a non-uniform log. To alleviate this problem each pulse position and pulse width modulators 23 individually operate to vary the width of the trace recorded on the recording medium in accordance with the rate of change of the signal to be recorded.

To this end, referring to FIG. 10, there is shown one of the pulse position and pulse width modulators. In actuality there are as many modulators as there are signal channels but since all such modulators are identical, it is only necessary to show one here. In FIG. 10, the channel signal from one of the low pass filters 22 (in this case, the channel $n$ signal is used) is applied to a voltage comparator 140 where it is compared in amplitude with the sweep signal from the sweep circuit 24. When the amplitude of the sweep signal exceeds the channel $n$ signal amplitude, the voltage comparator 140 changes from the "zero" to "one" state.

The channel $n$ signal is also applied to a second voltage comparator 141 after being delayed by a delay circuit 142. The voltage comparator 141 also compares the channel signal with the sweep signal to generate a "one" upon the sweep signal amplitude exceeding the channel signal amplitude.

The outputs of both voltage comparators 140 and 141 are applied to the input of an exclusive OR gate 143 which changes from the "zero" to "one" state when one, but not both, outputs of the voltage comparators 140 and 141 are at the "one" level. The leading edge of the resulting output pulse from the exclusive OR gate 143 energizes a one-shot 144 and the output pulses from the exclusive OR gate 143 and one-shot shown in FIG. 5E and the one shot 102 output pulses are shown in FIG. 5G.

The three stages of the binary counter 101 are connected to a binary to decimal converter 103 which produces an output signal on one of five output conductors during the first five count sequences of the binary counter 101.

As stated earlier, depth numbers are printed on the record medium 36 sequentially in reverse order as the record medium moves past the depth number printing CRT 67 (see FIG. 1) and since depth numbers are printed every 100 feet, the first two printed digits will be zero. Thus, the first and second output sequences from converter 103 are combined in an OR gate 112 and applied to the zero input position of the CRT numerical display unit 67 via and AND gate 113. The AND gate 113 is enabled by the output pulse from one-shot 102 to cause the CRT 67 to be flashed at the proper time and for the proper time duration to enable an appropriate exposure time on the film record medium 36.

The hundred, thousands, and ten thousands binary coded decimal signals from the depth memory register 86 are applied to three parallel binary coded decimal to decimal converters 104. The conjunctive combination of the third sequence output signal from the binary decimal to decimal converter 103 and the pulse from the one-shot 102 energizes ten individual parallel gates 105 by way of an AND gate 106. When energized, the gates 105 connect the ten output conductors from the hundreds foot portion of the binary coded decimal to decimal converter 104 to ten OR gates 114. The enabling pulse from AND gate 106 is shown in FIG. 5H.

The number 4 sequence output from the binary to decimal converter 103 and the pulse from one-shot 102 are combined in an AND gate 107 for energizing 10 parallel gate circuits 108. When energized, the parallel AND gates 108 connect the ten output conductors from the thousands foot portion of the binary coded decimal to decimal converter 104 to individual ones of the OR gates 114. The enabling pulse from AND gate 107 is shown in FIG. 5I.

In like fashion, the No. 5 sequence output from the binary to decimal converter 103 is combined with the output pulses from one-shot 102 in an AND gate 109 for energizing the parallel AND gates 110 during the fifth sequence of the binary counter 101. (See FIG. 5K.) When energized, the parallel AND gates 110 connect the ten output conductors from the ten thousands foot portion of the binary coded decimal to decimal converter 104 to individual ones of the OR gates 114. The outputs from the 10 OR gates 114 are connected to individual ones of the ten input terminals of the CRT numerical display unit 67. The leading edge of the No. 5 sequence output signal resets the flip-flop 98 and thus the AND gate 99 to prevent the counter 101 from being advanced beyond sequence No. 5.

To reset the binary counter 101, an AND gate 111 is responsive to the No. 2 output of the units foot position of the binary coded decimal to decimal converter 95 and the nine digit output of the tens foot output position of the binary coded decimal to decimal converter 96 for resetting the binary counter 101 whenever the tens and units digits of the depth number are 92.

Summarizing the operation of the digit selector circuit 65, whenever the last two digits of the depth number are 04 as determined by the AND gate 97, the flip-flop 98 is set to enable binary counter 101 to count the rising edges of the two foot depth signal from the depth interval detector 63, as seen by inspecting FIGS. 5A–5D. As seen in FIG. 5E, the binary counter 101 counts five rising edges of the two foot depth signal and then resets itself when the last two digits of the depth number are 92.

During the first two sequences, the binary to decimal converter 103 energizes the "zero" input of the numerical display unit 67 by way of the OR gate 2. During the third sequence, i.e., at a depth whose last two digits are 00, the number for the hundreds foot digit is gated by the parallel gates 105 to the proper input terminal of the numerical display unit 67 by way of the OR gates 114. Thus, for example, if the hundredths foot number is 6, the numerical display unit 67 will display the number 6 during sequence 3. During sequences 4 and 5 the thousandths and ten-thousandths foot numbers are likewise gated to the proper input terminals of the numerical display unit 67.

At the beginning of sequence 5, the flip-flop 98 is reset to thereby disable advancement of the binary counter 101. The binary counter 101 is then reset after the entire number has been printed by the pulse from AND gate 111.

Taking an example of this operation assume that the number to be printed is 5100 feet. At 5104 feet, the flip-flop 98 will be set and the binary counter 101 will advance to its first count sequence, thus enabling the AND gate 113 via OR gate 112. The pulse from one shot 102 then energizes the zero digit of the display unit 67 and a zero is printed at 5104 feet. Next, at 5102 feet the binary counter 101 advances to its number two count sequence and through the same operation a zero is again printed. At 5100 feet the binary counter 101 advances to its number three count sequence, thus enabling the AND gate 106 to pass the pulse from one shot 102 to the parallel gates 105. The hundredths foot portion of binary coded decimal to decimal converter 104 will, at this time, be generating an output signal on the number one output conductor such that when the gates 105 are energized, the number one digit of the display unit 67 will be energized. Then at the number four sequence, the number five output signal from the thousandths foot portion of converter 104 will energize the number five digit of the display unit 67. During the fifth sequence, the zero digit of the display unit 67 will be flashed. Then at 4992 feet, a safe time after the entire depth number has been printed, the system will be reset in readiness for the same operation to occur at 5004 feet for printing the depth number 5000.

Now concerning the depth interval detector 63, it operates in response to data from the depth register 90 and the divide by two flip-flop 93 to generate 2, 10, 50 and 100 foot signals. How the two foot signal is generated has already been discussed. To generate the 50 foot signal, a matrix circuit 120 is responsive to the tens foot portion of the depth register 90 to generate an output pulse every 50 feet. To generate the 100 foot signal, a matrix circuit 121 is responsive to the hundreds foot portion of the depth register 90 to generate a pulse every 100 feet. The ten foot depth pulses are obtained directly from the depth shift command output of the telemetry equipment 20 since, as discussed earlier, a depth word is transmitted every ten feet by the telemetry equipment described in the Miller et al patent.

The hundreds foot depth pulses from the detector 63 are applied to the hundred foot sawtooth generator 70

144 are ORed together in an OR gate 145 to produce the "writing signal" for application to the line coding circuit 45 (see FIG. 1). The output signals from the voltage comparators 140 and 141 are also ORed together in an OR gate 146 for application to the area coding card reader 47 for purposes to be explained later.

Concerning the operation of the FIG. 10 modulator and referring to FIGS. 11A-11E, FIG. 11A shows the sweep position signal and delayed and undelayed channel signals, the delayed channel signal being shown in dashed line form. FIG. 11B shows the output pulses from the exclusive OR gate 143 and FIG. 11D shows the output pulses from the OR gate 145. The resulting recording trace is shown in FIG. 11E.

By comparison of FIG. 11A and 11B it can be seen that the pulse width of the output pulses from the Exclusive OR gate 143 will vary as a function of the rate of change of the channel signal to be reached. Thus, as illustrated by the left-hand portion of FIGS. 11A and 11B, these pulse widths will be extremely narrow when the input channel signal does not vary in amplitude.

As seen by the intermediate portion of FIGS. 11A, when the channel signal begins to change in amplitude, the delayed channel signal will have the same change but at a delayed time. This causes the sweep signal to define a given time interval between the delayed and undelayed channel signals which defines the pulse width of the pulses of FIG. 11B. At the right-hand side of FIG. 11A, the input channel signal changes amplitude very rapidly, thus causing the sweep signal to define a long time interval between the time when the sweep signal amplitude equals the channel signal to the time when it equals the delay channel signal.

Thus, it can be seen that the faster the rate of change of the channel signal, the longer will be the duration of the output pulse from the exclusive OR gate 143. The one shot 144 acts to guarantee a minimum pulse width for the modulator output pulses such that minimum pulse width pulses will be generated when DC signals are being recorded. The combined output pulses from the exclusive OR gate 143 and one-shot 144 are shown in FIG. 11D and produce the recording traces of FIG. 11E.

Referring to FIG. 12, there is shown an example of a recording made using the modulator of FIG. 10. During the period when the channel signal does not vary in amplitude, it can be seen from FIG. 12 that dots will be recorded on the recording medium. However, when the amplitude of the signal begins changing, the transverse sweep lengths become longer, thus compensating for the increase in the rate of change of the input channel signal. The overall result is to produce a recording which is uniform in appearance regardless of the rate of change of the input channel signal.

Now, referring to FIG. 13 there is shown one of the parallel line coding circuits 45 of FIG. 1 in detail. Since all of the line coding circuits are identical, it is only necessary to show one circuit in detail. The function of the line coding circuits is to code the line which is recorded on the recording medium 36 to thereby enable easy identification of each of the various signals being recorded. Each line coding circuit receives an instruction from the line coding card reader 46 to produce a dotted, dashed, long dashed, or solid line on the recording medium.

One way of accomplishing this is to register a count for each sweep of the CRT beam and alternately blank and unblank the writing operation for a specified number of such sweep counts to produce the desired code. To this end, the sweep reset pulses from the sweep circuit 24 of FIG. 1 are applied to an OR gate 150 which, after processing by some logic circuits, are applied to a divider made up of a divide by five counter 151 and a divide by eight counter 152.

The feedback connections for the counters 151 and 152 are selectable to produce the desired line coding pattern. Thus, for example, a mark could be recorded for 40 sweeps and inhibited for 40 sweeps, or recorded for 160 sweeps and inhibited for 40 sweeps, etc. To perform the recording and inhibit function, the normal output of the last stage of the divide by eight counter 152 enables an AND gate 158 to pass the writing signal from the appropriate one of modulators 23 to the combining and logic circuit 42.

As discussed earlier, the length of the dots or dashes will be dependent on the rate of change of the channel signal to be recorded. In other words, if a dotting pattern is desired where marks are inhibited from being placed on the recording medium for 40 sweeps and then recorded for 40 sweeps, it can be seen that 40 sweeps for a DC signal will produce a much shorter line on the recording medium than 40 sweeps for a rapidly varying signal.

To provide a uniform line coding pattern regardless of the rate of change of the input channel signal, the writing signal from the proper modulator 23 enables an AND gate 153 which, when enabled, passes high frequency clock pulses from a clock source 154 to the other input of the OR gate 150. Thus, when the channel signal has a high rate of change, more pulses are applied to the counters 151 and 152 than for the case of a slowly varying signal. The frequency of the clock source 154 is chosen in accordance with the CRT beam sweep rate to produce the desired results.

Now, concerning how each of the individual line coding patterns are produced and first concerning the dotting pattern, the output pulses from OR gate 150 are applied to one input of an AND gate 155 and one input of an AND gate 156. The normal output of the last stage of the divide by eight counter 152 and the dotting control signal from the line coding card reader 46 enable the AND gate 156 to pass the pulses from the OR gate 150 to the count input of the divide by five counter 151 via an OR gate 157. Thus, when the line coding circuit is in the dotting mode and the normal output of the last stage of the counter 152 is at the "one" level, the counters 151 and 152 will, in conjunction, proceed to count 40 pulses from the OR gate 150. At the end of 40 pulses, the last stage of the counter 152 changes to its complementary state, thus disabling the output AND gate 158 and enabling the AND gate 155 to apply pulses to the input of the counter 151 via the OR gate 157. After 40 more pulses have been counted, the normal output of the last stage of counter 152 returns to the "one" state, thus enabling the AND gate 158 to pass writing signals to the combining and logic circuits 42 of FIG. 1 and enabling the AND gate 160 again. The process then repeats itself.

Thus, it can be seen that the line coding circuit of FIG. 13 will inhibit at least a selected portion of one writing signal from passing to the combining and logic circuits 42. As a maximum, it could inhibit many writing signals. The criteria for inhibiting the writing signals or portions thereof is not the number of writing signals themselves but the length of the line being recorded on recording medium 36. This length is a function of the pulse width of the writing signals from modulator 23. Thus, the AND gate 153 will gate a quantity of clock pulses to the counters 151 and 152 per sweep depending on the rate of change of the channel signal. The application of the sweep reset signal to the OR gate 150 for counting by counters 151 and 152 serves to set a minimum limit of one count per sweep when a DC signal is being recorded. Looking at the extremes, if the channel signal has a low rate of change, a great many writing signals would be inhibited and if it has a high rate of change, a portion of one writing signal would be inhibited or if the rate of change is very high, several non-adjacent portions of one writing signal could be inhibited.

The dashing and long dashing operations are very similar to the dotting operation exept that the waveform generated by the counter 152 will be unsymmetrical. This unsymmetrical waveform is produced by inserting a divide by four counter 159 in the feedback path from the normal output of the last stage of counter 152 to the input of the counters 151 and 152. Thus, during a dashing operation, an AND gate 160 is enabled such that when the normal output of the last stage of counter 152 goes to the "one" level, the pulses from OR gate 150 will be applied to the divide by four counter 159. By so doing, the absence of a recorded trace will be ¼ the length of the recorded traces on the record medium 36. To provide a long dashing operation, a divide by eight counter 161 is inserted in the feedback path. Thus, during such a long dashing operation, and AND gate 162 is enabled such that when the normal output of the counter 152 is at the "one" level, counters 161, 151 and 152 operate in a serial fashion to count pulses from the OR gate 150. This arrangement dictates that the recorded traces will be eight times as long as the absence of such traces thus giving a long dashed line.

To produce a solid line on the recording medium 36, a control signal designated "solid" from the line coding card reader 46 sets the last stage of the counter 152 to its normal state such that the AND gate 158 is always enabled to pass writing signals.

Now referring to FIG. 14, there is shown the area coding circuits 48 of FIG. 1 in greater detail. The area coding circuits of FIG. 14 are made up of twelve individual pattern generators which are utilized to generate the patterns shown in FIGS. 15A–15L. As discussed earlier, these coding patterns are generated whenever a selected channel signal assumes a predetermined relationship to a second channel signal. The area coding card reader 47 selects certain ones of the pulses generated by the OR gate 146 (see FIG. 10) of each modulator of the parallel position and pulse width modulators 23 as "start" signals (start coding) and certain ones as "stop" signals. The area coding card reader 47 also selects certain ones of the divided clock signals from the binary counter 31 (FIG. 1A) for application to the area coding circuits. In FIG. 14, these signals are designated SC2, SC4, SC8, etc., with the number following SC indicating the stage of the counter 31, i.e., SC2 indicates that the second stage of the counter 31 has been selected.

Figure 15F:
Figure 15E:
Figure 15D:
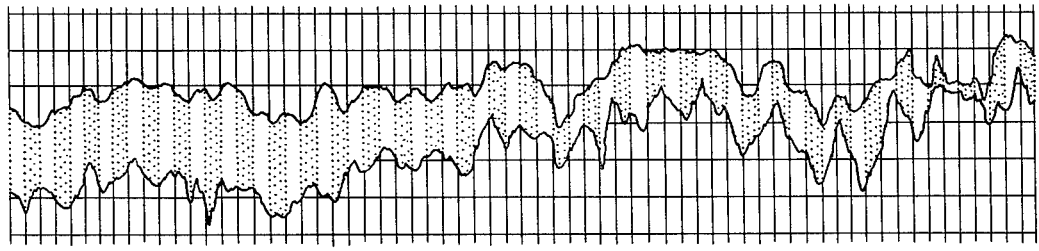
Figure 15C:
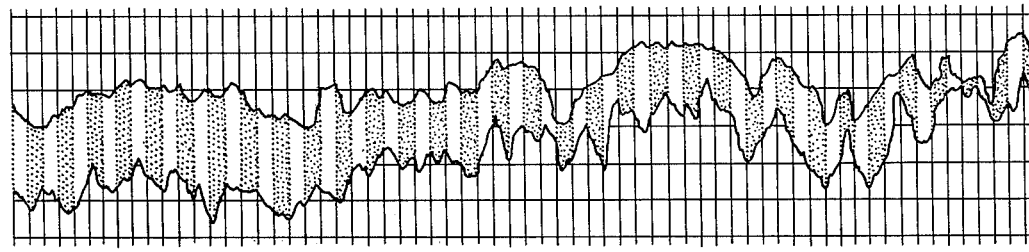
Figure 15B:
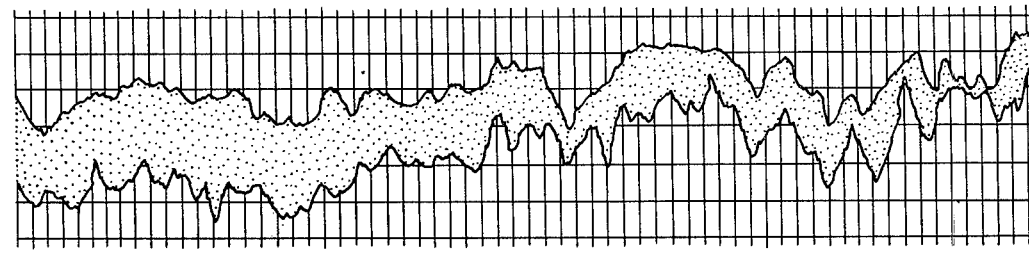
Figure 15A:
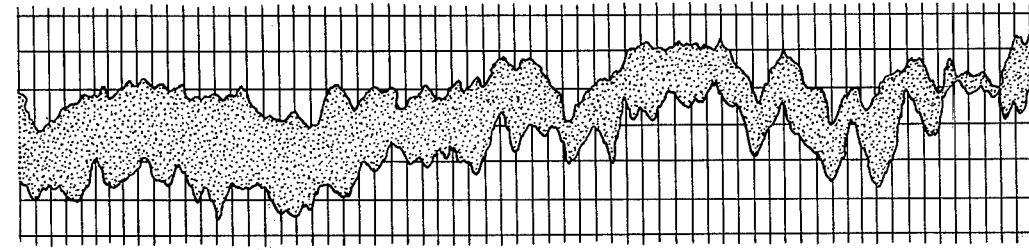

The first circuit to be described will produce the area coding pattern shown in FIG. 15A. This pattern usually designates oil. In FIG. 14, a divide by four counter 171 counts the trailing or rising edges of inverted sweep reset pulses, designated $\overline{SR}$, produced by inverting the sweep reset pulses from the sweep circuit 24 of FIG. 1. The falling edges of the square wave output signal from the divide by four flip-flop 171 and the inverted sweep reset pulses $\overline{SR}$ from the NAND gate 172 energize the set and reset inputs respectively of a flip-flop 173. The rising edges of the output signal from the normal output contact of the flip-flop 173 toggle a flip-flop 174 which, when the normal output of flip-flop 173 is at the "one" level, enable a pair of AND gates 175 and 176 respectively to pass the sweep counter signals SC2 and $\overline{SC2}$ respectively to a "trace length one-shot" 177. The pulse width of the pulse generated by the one-shot 177 is set such as to produce the desired trace length on the recording medium, i.e., it determines the unblanking time of the cathode ray tube 25.

To insure that the oil coding pattern is printed only when one selected channel signal has a predetermined relationship with the other selected channel signal, he trace length pulses from one shot 177 are combined in an AND gate 178 with the start and stop signals from the area coding card reader 47. The card reader 47 provides the inversion of the stop signals.

The card reader 47 selects those area coding control signals which are utilized as the start and $\overline{stop}$ signals for each of the pattern generators of FIG. 14. Thus, for example, if the oil coding pattern generated by the circuit 170 is to be printed on a recording medium whenever the channel 2 signal is greater in amplitude than the channel 4 signal, the card reader 47 will select the channel 4 signal as the $\overline{stop}$ signal and apply these to the oil coding circuit 170. To insure that no scale and depth lines are recorded while the area coding pattern is being recorded, the start and $\overline{stop}$ signals from the area coding card reader 47 are combined in an AND gate 179 to produce a control signal representative of the time interval during which the area coding pattern is being generated. This area coding blanking signal is applied to the combining and logic circuit 42, which as will be discussed later, blanks out depth and scale lines while the area coding pattern is being recorded.

To better understand how this conditional area coding operation takes place, refer to the oil coding circuit 170 of FIG. 14 in conjunction with FIGS. 16A–16F. FIG. 16A is an illustration of the sweep signal overlayed on the channel signals which are selected by the area coding card reader 47 as the start and $\overline{stop}$ signals for use by the area coding circuits. FIG. 16B shows the sweep reset pulse generated by the sweep circuit 24 of FIG. 1.

It will be recalled from the discussion of the modulator of FIG. 10 that the output of the OR gate 146 will rise to the "one" level upon the sweep voltage exceeding the channel signal amplitude and will remain at that level until the sweep signal amplitude is less than the channel signal amplitude. Thus the area coding control signal generated by the modulator which is processing the signal designated "start" in FIg. 16A will produce the area coding control signal of FIG. 16C. Likewise, the modulator which is processing the channel signal designated "stop" in FIG. 16A will produce an inverted version of the area coding control signal shown in FIG. 16D. (The $\overline{stop}$ signal is illustrated in FIG. 16D). Through action of the area coding card reader 47, the signal in FIG. 16C becoms the start signal and the control signal of FIG. 16D becomes the $\overline{stop}$ signal which are applied to the AND gates 178 and 179.

The conjunctive function, start $\overline{\text{stop}}$ is shown in FIG. 16E and, through the action of AND gate 179, comprises the area coding blanking signal. Likewise, through the action of AND gate 178, start and $\overline{\text{stop}}$ enables the area coding signal pulses from the trace length one-shot, shown in FIG. 16F, to be applied to the combining and logic circuit 42 as the area coding writing signal whenever the normal output of the flip-flop 173, shown in FIG. 16G, is at the "one" level. Since the flip-flop 173 is set only once every four sweeps, after the sweep reset pulse 180 of FIG. 16B resets flip-flop 173 (see FIG. 16G), this flip-flop will remain in a reset state for the next four sweeps. Then it will be set by the fourth reset sweep pulse after pulse 180 to allow the area coding signal of FIG. 16F to be passed.

It can, therefore, be seen that the oil coding circuit 170 will operate to produce evenly spaced dots on the recording medium 36 for one out of every four sweeps in the area bounded by the logs selected by the area coding card reader as the starter and stop logs. The space between each dot in the direction of the sweeping beam (transverse to the record medium 36) will be determined by the counter signal SC2. The toggle FF 174 changes state, every fourth sweep, and alternately enables gates 175 and 176, thus alternately connecting SC2 and $\overline{\text{SC2}}$ counter signals to the one-shot 177. This staggers the dots printed on alternate lines of dots.

Now, concerning the circuit for producing a coding pattern which designates "gas", refer to the "gas coding circuit" 182 of FIg. 14. This gas coding circuit 182 operates in a manner very similar to the oil coding circuit 170 except that only one sweep out of eight is utilized to produce dots on the recording medium and these dots are spaced twice as far apart as those for the oil coding circuit 170.

The major portion of the gas coding circuit 182 is the logic circuit A portion of the oil coding circuit 170. In circuit 170, this logic circuit A comprises all of the oil coding circuit 170 except the divide by four circuit 171 and is that portion of the oil coding circuitry enclosed by the dashed lines.

To produce the recording of dots once every eight sweeps, the square wave output signal from the divide by four flip-flop 171 of circuit 170 is applied to a divide by two flip-flop 183. The output of the divide by two flip-flop 183 is thus equal to $\overline{\text{SR}}/8$ and is applied to the set input of the corresponding flip-flop 173 within the logic circuit A of the gas coding circuit 182. To produce the wider spacing of dots during those sweeps when dots are recorded, the SC4 and $\overline{\text{SC4}}$ signals from the binary counter 31 of FIG. 1 are applied to AND gate within the logic circuit A of the gas coding circuit 182 which correspond with the AND gates 175 and 176 of the oil coding circuit 170. The resulting pattern produced on the recording medium is illustrated in FIG. 15B.

Looking now at FIG. 15C, there is shown the area coding pattern used to designate "sand". It can be seen that the dots recorded for this pattern are further spaced apart than the dots for the pattern shown in either FIGS. 15A or 15B. Returning to FIG. 14, the "sand logic circuit" 185 acts to produce this coding pattern of FIG. 15C. The sand logic circuit includes the logic circuit A discussed earlier. To produce the wider spaced dots, the $\overline{\text{SR}}/8$ square wave signal from the flip-flop 183 is applied to a divide by two flip-flop 186 within the sand logic circuit 185 so that the dots will be recorded only once every sixteen sweeps. Moreover, the SC8 and $\overline{\text{SC8}}$ signals from the binary counter 31 of FIG. 1 are applied to the AND gates of the sand logic circuits 185 which correspond to the AND gates 175 and 176 of the logic circuit A of the oil coding circuit 170.

The next pattern generator to be discussed will produce the coding pattern seen in FIG. 15D. This figure 15D pattern comprises alternate light and dark stripes which run transversely of the record medium. This FIG. 15D pattern designates "movable oil." To produce this pattern is the function of the "movable oil coding circuit" 190 of FIG. 14. The coding circuit 190 alternately passes and inhibits the pulses generated by the trace length one-shot 177 of the oil coding circuit 170 during alternate two foot sections on the recording medium 36.

To accomplish this, the output pulses from the trace length one-shot 177 of circuit 170 are applied to an AND gate 191 within the movable oil coding circuit 190. The start and $\overline{\text{stop}}$ signals from the area coding card reader 47 enable the AND gate 191 when the conditional coding format is satisfied. To provide the alternate recording an inhibiting of the pulses generated by the trace length one-shot 177 during successive two foot sections, the two foot sweep signal from the depth interval detector 63 and the sweep control signal from sweep circuit 24 of FIG. 1 are combined in an AND gate 192 and the trailing edge of the resulting output pulses from AND gate 192 trigger a toggle flip-flop 193 whose normal output enables the AND gate 191. By this arrangement, the flip-flop 193 will enable the AND gate 191 once every other two foot section to produce the pattern indicated in FIG. 15D.

The start and $\overline{\text{stop}}$ signals are combined in an AND gate 194 whose output signal is the area coding blanking signal which is applied to the combining and logic circuits 42 to blank out the writing of scale and depth lines when the movable oil coding pattern is being recorded.

The next pattern generator to be described produces the area coding pattern shown in FIG. 15E. It can be seen that this area coding pattern is similar to the one shown in FIG. 15D except that the dotting pattern produced for the dark sections is more widely dispersed, thus giving a lighter or greyish appearance to the dark sections thereof. This pattern of Fig. 15E designates "movable gas" and is generated by the "movable gas coding circuit" 196 in FIG. 14.

The movable gas coding circuit 196 includes a toggle flip-flop 193A which is toggled by the output pulses from the AND gate 192. An AND gate 191A is responsive to the start and $\overline{\text{stop}}$ signals selected by the area coding card reader for the movable gas coding circuit 196 and the normal output of the flip-flop 193A for passing the trace length pulses produced by logic circuit A of the gas coding circuit 182. These passed or gated $\overline{\text{SR}}/8$ pulses constitute the area coding writing signal from the movable gas coding circuit 196. An AND gate 194A responds to the start and $\overline{\text{stop}}$ signals selected by the card reader for the removable gas circuit 196 to generate the area coding blanking signal for coding circuit 196.

The difference between the movable gas coding circuit 196 and the movable oil coding circuit 190 is that in the former, the AND gate 191A is responsive to the pulses generated by the trace length one-shot (corresponding to one-shot 177 of coding circuit 170) within logic circuit A of the gas coding circuit 182 while the latter uses the trace length pulses from one-shot 177. Thus, the oil pattern of FIG. 15A will make up the dark areas of the movable oil pattern of FIG. 15D while the gas pattern of FIG. 15B will make up the dark areas of the FIG. 15E movable gas pattern. Since the oil dotting pattern of FIG. 15A is denser and thus darker in appearance than that for the gas coding pattern of FIG. 15B, the dark sections of FIG. 15E will appear lighter than those of FIG. 15D.

The next pattern generator to be described produces the coding pattern shown in FIG. 15F. This coding pattern comprises the absence of all marks in the area for which coding is desired and represents porosity. To produce this pattern is the function of the porosity coding circuit 198 of FIG. 14. The porosity coding circuit 198 through an AND gate 199 merely responds to the $\overline{stop}$ and start signals selected by the area coding card reader 47 for the porosity coding circuit to prevent the writing of all data between the start and stops logs. The output signal from AND gate 199 constitutes the area coding blanking signal for the coding circuit 198.

The next pattern generator to be described produces the coding pattern of FIG. 15G, which is the coding pattern for "water." This coding pattern comprises a light area between the start and stop logs, broken only by the presence of scale lines. To provide this coding pattern, a "water coding circuit" 200 of FIG. 14 includes an AND gate 201 which is responsive to the start and $\overline{stop}$ signals from the card reader 47 for this circuit for generating the area coding blanking signal which inhibits the writing of data in the area bounded by the start and stop logs. Then, to produce the scale lines, the scale line signal from the OR gate 41 of scale line circuit 37 of FIG. 1 is applied to an AND gate 202 which is also responsive to the start and $\overline{stop}$ signals for producing the area coding writing signal for the water coding circuit. Thus, the AND gate 202 reinserts the scale line signals which have been inhibited by the action of the AND gate 201.

The next pattern generator to be described produces the coding pattern of FIG. 15H which is the pattern for a type of shale which, for present purposes, is designated shale No. 1. As seen in FIG. 15H, this coding pattern is defined by vertically spaced apart dashed lines wherein the dashes are staggered from one depth level (transverse or vertical lines on the record medium) to the next and is generated by the shale No. 1 coding circuit 205 of FIG. 14.

Within the coding circuit 205, a flip-flop 206 is set by the SR/16 pulses and reset by the $\overline{SR}$ pulses. The rising edge of the normal output of flip-flop 206 toggles a toggle flip-flop 207 whose normal and complementary outputs enable a pair of AND gates 208 and 209 respectively to pass the sweep counter 31 square wave signals SC16 and $\overline{SC16}$ respectively. The outputs of both AND gates 208 and 209 energize a trace length one-shot 210 which generates a pulse whose duration is selected to produce a trace length corresponding to those shown in FIG. 15H. The output pulses from the trace length one-shot 210, along with the start and $\overline{stop}$ signals selected by the area coding card reader 47 for this coding circuit are combined in an AND gate 211. The resulting output signal from AND gate 211 constitutes the area coding writing signal for the shale No. 1 coding circuit 205. An AND gate 212 is responsive to the start and $\overline{stop}$ signals selected for this coding circuit for producing the area coding blanking signals.

It can be seen that the flip-flop 206 will be set once every sixteen sweeps to thereby causes the energization of the trace length one-shot 210 once per 16 sweeps. The vertical or transverse distance between the initiation of each trace written on the recording medium is set by the SC16 and $\overline{SC16}$ counter signals. By way of comparison, this distance for the shale No. 1 pattern is eight times greater than that for the oil pattern of FIG. 15A since the counter signals SC2 and $\overline{SC2}$ are used by the oil coding circuit 170. It can be seen that every other time the flip-flop 206 is in its normal state, one or the other of the AND gates 208 and 209 will be enabled to pass the SC16 and $\overline{SC16}$ signals respectively thus causing the traces to be staggered on the recording medium 36.

The next pattern generator to be described will produce the coding pattern shown in FIG. 15I which corresponds to a second type of shale, designated "shale No. 2." As seen in FIG. 15I, this coding pattern is similar to the coding pattern of FIG. 15H except that the vertically directed dashes are longer and further spaced apart. This coding pattern is generated by the shale No. 2 coding circuit 215 of FIG. 14. To produce this pattern, the coding circuit 215 uses the normal output of the flip-flop 207 of the coding circuit 205 to enable a pair of AND gates 216 and 217 which are also responsive to the sweep counter signals SC32 and $\overline{SC32}$ respectively. The output pulses from AND gates 216 and 217 energize a trace length one-shot 218. An AND gate 220 passes these trace length pulses as the area coding writing signal for coding circuit 215 when the start and $\overline{stop}$ signals selected for this circuit 215 are both at the "one" level. As before, an AND gate 221 responds to the start and $\overline{stop}$ signals selected for circuit 215 to produce the area coding blanking signal for this circuit.

Since the normal output of the flip-flop 207 will be one-half the frequency of the flip-flop 206 output signal, the sweeps for which traces are recorded will be twice as far apart as for the shale No. 1 coding pattern. Likewise, since the SC32 and $\overline{SC32}$ counter signals are used instead of SC16 and $\overline{SC16}$, the trace length one-shot 218 of the shale No. 2 coding circuit 215 is energized one-half as often as for the shale No. 1 coding circuit 205. The trace length one-shot 218 has a timing circuit set to produce pulses having a pulse width greater than that for the trace length one-shot 210 of coding circuit 205 to produce longer length dashes on the record medium 36. To provide for staggering the dashes on alternate writing sweeps, the AND gates 216 and 217 are alternatley enabled by the flip-flop 219 to pass the counter signals SC32 and $\overline{SC32}$ on alternate writing sweeps.

The next pattern generator to be described will produce the coding pattern of FIG. 15J which designates limestone. This coding pattern is made up of a plurality of spaced vertical lines having interconnecting horizontal lines between each pair of vertical lines, which horizontal lines are vertically staggered from one pair of vertical lines to the next. The circuit for generating this pattern is the limestone coding circuit 225 of FIG. 14.

To produce the spaced apart vertical lines, AND gate 226 is responsive to the coincidence of the two foot sweep signal and sweep control signal from the AND gate 192 and the start and $\overline{stop}$ signals selected by the area coding card reader 47 for this coding circuit 225 to produce a vertical (transverse to the record medium) line once every two feet. To produce the staggered horizontal lines, the rising edges of the two foot sweep control signal from AND gate 192 toggles a divide by two flip-flop 231 whose normal and complementary outputs enable a pair of AND gates 232 and 229 respectively. When enabled, the AND gates 232 and 229 pass the sweep counter signals SC32 and $\overline{SC32}$ to energize a trace length one-shot 230. The time period of the pulses generated by the one-shot 230 are small so as to produce dots on the recording medium. The output pulses from the trace length one-shot 230 are then combined in an AND gate 227 with the start and $\overline{stop}$ signals selected for this coding circuit so as to produce writing signals which will produce the staggered horizontal line shown in FIG. 15J.

The output signals from AND gates 226 and 227 are then combined to produce the area coding writing signal for the limestone coding circuit 225 to produce the pattern of FIG. 15J. As before, the area coding blanking signal is produced by combining the start and $\overline{stop}$ signals in an AND gate 228.

Summarizing the operation of this limestone coding circuit 225, the AND gate 226 operates to produce the vertical lines shown in FIG. 15J. (In actuality, the area coding blanking signal produced by the AND gate 228 inhibits the writing of depth lines between the start and stops logs and the AND gate 226 merely reinserts the two foot depth lines in this area.) To produce the horizontal lines, the edge of one of the SC32 and $\overline{SC32}$ square wave counter signals periodically energizes the trace length one shot 230 to produce dots on the recording medium a the same vertical position during each sweep. Thus, during a succession of sweeps, a horizontal line will be produced. Then, when the next 2 foot depth line is reinserted by the AND gate 226 in the area normally set aside for area cooling, the two foot sweep control signal from AND gate 192 which causes this depth line to be reinserted also toggles the divide by two flip-flop 231 to reverse the enable-disable configuration AND gates 232 and 229 and thus of SC32 and $\overline{SC32}$. By so doing, the staggering of the horizontal lines between vertical line pairs is produced.

The next pattern generator to be described produces the area coding pattern of FIG. 15K, which represents dolomite. As seen in FIG. 15K, this pattern is very similar to the limestone coding pattern of FIG. 15J except that the horizontal lines for limestone are slanted for dolomite. To produce this coding pattern is the function of the dolomite coding circuit 235 of FIG. 14.

The reinsertion of the two foot depth line is produced in this circuit 235 by an AND gate 236 which is responsive to the coincidence of the 2 foot sweep signal and the sweep control signal, and the start and $\overline{stop}$ signals selected by the area coding card reader 47 for this coding circuit. This is essentially the same function as was performed by AND gate 226 of the limestone coding circuit 225. To produce the slanted lines between the 2 foot vertical lines, the rising edges of the square wave output signals produced by either of the AND gates 232 or 229 of the limestone coding circuit 225 set a flip-flop 237. When the flip-flop 237 is set, an AND gate 238 is enabled to pass the clock pulses designated CL from the sweep circuit 24 of FIG. 1 to the count input of a down counter 239 ("down counter" signifies that this counter 239 subtracts a count for each pulse supplied thereto). When the contents of the down counter 239 have been completely subtracted away, the leading edge of the resulting borrow pulse resets the flip-flop 237. When the flip-flop 237 is reset, a trace length one-shot 240 generates a short time duration pulse which, during the coincidence of the start and $\overline{stop}$ signals selected by the area coding card reader 47 for this coding circuit, is passed by an AND gate 241 as part of the area coding writing signal for this coding circuit. The outputs of AND gates 236 and 241 comprise the area coding writing signal for the dolomite coding circuit.

What has been described thus far in the dolomite coding circuit 235 would produce the limestone pattern of FIG. 15J given by the limestone coding circuit 225, i.e., the lines between the vertically extending two foot depth line would be horizontal. To provide for slanting lines, a binary counter 242 is advanced one count for each sweep reset signal applied to its count input. i.e., it is advanced one count per sweep. The leading edge of the sweep reset pulses causes the counter 242 to advance. The contents of the binary counter 242 are transferred to the down counter 239 in response to the trailing edges of the pulse from the one-shot 240. Thus, for each sweep of the CRT beam, the number placed in the down counter 239 increases by one count thus causing the down counter 239 to receive one more CL pulse per sweep for the contents thereof to be emptied. Consequently, it takes a slightly greater time for each additional sweep for the trace length one shot 240 to be energized thus producing a slanted line.

At every two foot depth interval, the binary counter 242 is reset by the two foot sweep control signal from AND gate 192 to initiate the production of the slanted line between the next pair of two foot depth line. Since the two foot sweep control signal toggles the flip-flop 231 for alternately enabling AND gate 232 and AND gate 229, the slanted lines will be staggered because of the alternate selection of the SC32 and $\overline{SC32}$ counter signals by the AND gates 232 and 229.

The area coding blanking signal is produced by an AND gate 243 in response to the start and $\overline{stop}$ signals in the usual manner.

The last pattern generator to be described produces the coding pattern of FIG. 15L which identifies anhydrite and is produced by the anhydrite coding circuit 245. This coding pattern is a slanted line pattern within the area bounded by the start and stop logs selected by the card reader 47. To produce this pattern, a divide by 40 counter 247 counts both the clock pulses CL from the high frequency clock 29 of FIG. 1 and the sweep reset pulses from the sweep circuit 24 of FIG. 1, which are combined in an OR gate 246. An edge of the square wave output signal from the counter 247 energizes a trace length one-shot 248 which generates pulses having a short time duration so as to produce dots on a recording medium. These pulses generated by the one-shot 248 are combined in an AND gate 249 with the start and $\overline{stop}$ signals so that the coding pattern will be produced only between the selected start and stop logs. The start and $\overline{stop}$ signals are also combined in an AND gate 250 to produce the area coding blanking signal in the same manner as discussed previously.

Neglecting for the moment the effect of the sweep reset pulses, the clock pulses would, after division by the divide by forty counter 247, cause a dot to be placed on the recording medium at the same vertical (or transverse) position for each sweep, thus producing a plurality of horizontal lines spaced apart a distance corresponding to CL/40. However, since the sweep reset pulses are also counted by the counter 247, the net effect is to move the vertical point at which the dot is recorded for each sweep a given vertical increment. Thus, since the recorded dot is moved a given vertical increment for each sweep, the net result is to produce slanted lines within the area defined by the start and stop logs.

Now, referring to FIG. 17, there is shown the combining and logic circuit 42 and the CRT brightness control circuits 50 of FIG. 1 in greater detail. First, concerning the combining and logic circuit 42, it is the function of this circuit to combine the writing signals from the parallel line coding circuits 45, the area coding circuit 48, as well as the trace intensified writing signals from card reader 49, and the scale and depth line signals from the scale line circuit 37 and depth line generator 64 for application to the CRT 25. In addition to these combining operations, circuit 42 also performs certain logic operations to give a desired recording format.

The line coded writing signals from the line coding circuits 45 of FIG. 1 are combined in an OR gate 260 and the area coding writing signals from the area coding circuits 48 are combined in an OR gate 261. The outputs of OR gates 260 and 261 are combined in OR gate 262 for application to one input of an AND gate 263.

As discussed earlier, no data is to be written on the recording medium while the initial scale line is being printed and during the fly-back of the cathode ray tube means, i.e., during sweep reset. Therefore, the initial scale line and sweep reset pulses, after inversion by a pair of NAND gates 264 and 265, respectively, are applied to individual inputs of the AND gate 263 so as to inhibit any writing signals from OR gate 262 during printing of the initial scale line and fly-back of the cathode ray tube beam. The output of the AND gate 263 is applied to a limiter circuit 266 which sets the desired voltage level for the output signals from AND gate 263 and then applies the signals to the CRT brightness control circuit 50.

The scale and depth lines are combined in an OR gate 267 for application to a limiter circuit 268 which performs the same function as limiter circuit 266 and then applies the scale and depth line signals to the CRT brightness control circuit 50. To insure that a depth line signal is generated only during the time the beam is being swept across the usable portion of the recording medium, the depth line signal and sweep control signal are combined in an AND gate 269 before being applied to the OR gate 267. Moreover, since as discussed earlier, scale and depth lines are not to be written in the depth track, the depth track inhibit signal from the scale grid card reader 38 (se FIG. 1A) is used to disable the AND gate 269 and an AND gate 270 to which the scale line signals are applied whenever the CRT beam is being swept through the depth track. Also depth and scale lines are not to be recorded whenever one of the area coding pattern generators is operating to produce a pattern (except where the pattern generator itself reinserts the depth or scale line) or when a channel signal is being recorded. To accomplish this function, the area coding blanking signals from the area coding circuits 48 are combined in an OR gate 271 and the output of this OR gate is combined with the output of AND gate 263 in an OR gate 272. The output signal from the OR gate 272 thus represents the combination of the area coding blanking signal and the line and area coding writing signals. Since scale and depth lines are not to be recorded when any of these other signals are processed for recording, the output control signal from OR gate 272 is inverted by a NAND gate 273 and applied to the input of an AND gate 274, to which also is supplied the output from OR gate 267. Thus, the AND gate 274 will be disabled whenever the channel signals are being recorded and during area coding.

In addition to the above, the combining and logic circuit 42 also combines the trace intensifier signals from the trace intensifier card reader 49 of FIG. 1 in an OR gate 275, and the amplitudes of the signals from OR gate 275 are limited by a limiter circuit 276 before application to the CRT brightness control circuit 50. The amplitude level of the limiter circuit 276 is set high enough to enable a higher amplitude level for these trace intensified output signals from OR gate 275 than the scale and line signals from gates 267 and 274 and the line and area coded writing signals from AND gate 263.

Now, concerning the CRT brightness control circuit portion of FIG. 17, the line and area coded writing signals, scale and depth line signals, and trace intensifier signals from the limiter circuits 266, 268, and 276 respectively of the combining and logic circuit 42 are fed to the negative or inverting input of an operational amplifier 280 via summing and weighting resistors 294, 295 and 296 respectively. The values of these resistors 294, 295 and 296 are set in conjunction with the limiting values of the limiter circuits 266, 268 and 276 to bring about the proper relationship of trace intensities for the coded writing signals, scale and depth line signals, and trace intensifier signals. These combined signals are then further processed by the CRT brightness control circuits 50 for use in unblanking the CRT beam.

With a CRT having a fiber optic faceplate, the anode must be operated at ground potential, thus necessitating that the grid and cathode be at a high negative potential, e.g., approximately −10,000 volts. Since the signals of the operational amplifier 280 are within a few volts of ground potential, these signals must be translated through a level of thousands of volts. To alleviate this problem, a transformer 284 isolates the two circuits and the amplitude of a high frequency signal produced by an oscillator 282 is controlled by the output signals from amplifier 280. To this end, the amplifier 280 signals control the gain of a variable gain amplifier 281 to which the high frequency signal from oscillator 282 is applied. The output signal from amplifier 281 feeds the primary winding 283 of a transformer 284 with one side of the primary winding 283 being connected to the same circuit ground as the amplifier 280. On the secondary side of the transformer 284, the signals are detected by the detector 285, i.e., converted to signals which resemble the signals produced by the amplifier 280, and applied to an amplifier and pulse shaper 286. This circuit 286 operates to produce the final amplification to obtain the voltage level necessary for the cathode ray tube 25 and shape the pulses in a manner to compensate for the non-linear effects of the cathode ray tube 25.

As discussed earlier, the beam intensity of a cathode ray tube can vary during the operation of the tube. Of course, such a variation in beam intensity would be undesirable for present purposes because it would tend to vary the quality of the recording. To alleviate this problem, a current to voltage converter 287 monitors the beam current at the anode of the cathode ray tube 25 and supplies a voltage proportional thereto to the summing input of the amplifier 280 to thereby maintain this beam current constant. However, since the beam current is being modulated in accordance with the information to be recorded, the beam current cannot be monitored indiscriminately because of the wide fluctuation or variation in this modulation during any given sweep.

To provide a valid measure of beam current, a sample and hold circuit 288 is responsive to the initial scale line signal from the scale line circuit 37 of FIG. 1 for instructing the sample and hold circuit 288 to sample the voltage output of the converter 287 only when the initial scale line is being recorded. It will be recalled from the discussion of FIG. 1 that the initial scale line pulse was combined with the other scale line pulses in the OR gate 41 for application to the combining and logic circuit 42 as the "scale line signals." It will also be recalled from the discussion of the combining and logic circuit 42 of FIG. 17 that the initial scale line pulse caused all other writing signals to be inhibited. Thus, it can safely be assumed that the output signal from the amplifier 280 will always be of constant amplitude while the initial scale is being recorded.

Since the sample and hold circuit 288 operates to sample this beam current only when the initial scale line is being recorded, the beam current can be measured once per sweep and adjusted in response to this measurement to provide the desired beam intensity throughout the remainder of the sweep. To this end, the output signal from the sample and hold circuit 288 is applied to a low pass filter 289 which filters out transients occurring during this sampling process and applies the measured beam current indication signal to a suitable meter 290 and to the summing input of the amplifier 280 via a summing resistor 291. The time constant of the low pass filter 289 can be selected high enough to prevent one or two erroneous measurements from completely upsetting the appearance of the recording, i.e., the feedback system will only respond to relatively slow changes in beam current intensity.

A "brightness adjust potentiometer" 292 also provides current to the summing input of the amplifier 280 via a summing resistor 293. The position of the potentiometer 292 can be preset to give the desired brightness level.

The recording system described up to this point derives data from telemetry equipment for recording. It would also be possible to record data while the exploring device which makes the measurements is moved through the borehole. This could be accomplished by recording the measurements derived directly from the downhole exploring device or recording this data after it has been digitized by a digital tape recorder.

First concerning the recording of data from a digital tape recorder simultaneously with writing the well logging measurements on magnetic tape, refer to FIG. 18. In FIG. 18, a well tool 300 is suspended in a borehole 301 by a multi-conductor cable 302 for investigating the surrounding earth formations 303. The measurement signals produced by the well tool 300 are transmitted to suitable signal processing circuits 304 over the conductors of the cable 302. The signal processing circuits operate to, for example, reference the signals to a common reference potential and depth. The processed signals are then applied to a digital tape recorder 305 which digitizes the measurements and writes them on magnetic tape. The tape recorder 305 could comprise any digital tape recorder. One example of a suitable tape recorder is disclosed in U.S. Pat. No. 3,457,544 granted to G. K. Miller et al on July 22, 1969.

This Miller et al tape recorder produces a plurality of signals which are used by the recording equipment of the present invention. It produces a plurality of channel selection signals 306 which designates the channel for which PCM data on a conductor 307 corresponds to. It also generates shift pulses for use by exterior equipment in shifting the PCM data into a suitable entry register and a "shift pulse window" for use in properly gating the shift pulses to insure that the proper number of shift pulses are used. Finally, it generates a "depth word" signal whenever a depth word is on the PCM data line 307. To produce the digital data words as a function of borehole depth, a shaft 313 which is rotatably connected to a wheel 314 in rotatable engagement with the cable 302 is connected to the input of the tape recorder 305. This shaft causes a circuit within the tape recorder 305 to generate incremental depth pulses at given depth increments which are used to initiate the digitizing operation. For more information on this tape recorder and how it produces these signals, refer to the Miller et al U.S. Pat. No. 3,457,544.

Now concerning how the digital data from the tape recorder 305 is processed for application to the recording equipment of FIG. 1, the PCM data line 307 from the tape recorder 305 is connected to the inputs of a plurality of individual storage registers 308. The particular register which the PCM data is entered into is selected by the channel designation signals on conductors 306, i.e., one channel designation conductor at a time will be active to thereby activate one storage register at a time to enter the PCM data. The shift pulses and shift pulse window signal from the tape recorder 305 are combined in an AND gate 317 for application to each of the individual storage registers 308. Thus, a particular storage register will be selected by one of the channel designation signals and the PCM data will be entered into this selected register under control of the gated shift pulses.

The output stages of the storage registers 308 are connected to digital to analog converters 309, the output stages of each storage register 308 being connected to an individual digital to analog converter. Thus, each converter 309 will produce an analog output signal whose amplitude is proportional to the digital number contained in each storage register 308, i.e., one analog signal per channel.

As set forth in the Miller et al tape recorder patent, word 1 of each frame is reserved for the depth word. Since there is no need to convert depth words into analog quantities, the analog signals from converters 309 are sampled during the time period when the depth word is being processed by the tape recorder 305. To this end, the leading edge of the depth word control signal from tape recorder 305 energizes a "strobe one-shot" 310 which applies a strobe pulse to suitable sample and hold circuits 311. When strobed, the sample and hold circuits 311 sample the analog voltages from the digital to analog converters 309. The stored analog signals in sample and hold circuits 311 are then applied to the filters 22 of FIG. 1 in place of the signals from the telemetry unit 20.

A plurality of bias circuits 312 operate to selectively bias the analog well logging signals to place them in selected tracks on the recording medium. In the FIG. 1 system, it was assumed that this bias operation was taken care of prior to processing of the data by the FIG. 1 circuits, i.e., the data outputed from the input equipment 20 already include the proper bias. Of course, if desired, bias circuits could be included in the FIG. 1 apparatus (just after the low pass filters 22) to perform this operation.

To supply the depth data to the FIG. 1 recorder circuits, the shift window, depth word designation signal and shift pulses are all applied to the AND gate 91 of FIG. 4 so as to enable the PCM depth word to be entered into the entry register 90. The depth word is then processed in the manner discussed earlier to provide depth indications on the recording medium.

In this case where the well logging measurements are recorded while they are being made by the well tool 300, the recording medium is driven by the shaft 313. In this case, also for optimum results, the CRT beam sweep repetition rate should not be at a constant frequency. Of course, for good recording resolution, there should be plurality of sweeps between sampling and digitizing of the well logging measurements. In the Miller et al tape recording system, the depth word designation signal is generated every time the well logging measurements are sampled, for most applications. Thus, the strobe pulse from the one-shot 310, which was energized by the depth word designation signal, is applied to a sweep pulse generator 315. The generator 315 generates a plurality of pulses per strobe pulse which are applied to the set input of the sweep control flip-flop 27 (FIG. 1A). In this embodiment, the 120 Hertz pulse generator 26 would be disconnected.

The sweep pulse generator 315 could take the form of a pulse generator which generates a fixed number of pulses when energized. Each generated pulse would energize a recorder drive stepping motor 316 which when energized, would cause the recording medium to step a predetermined incremental distance. This stepping of the recording medium is synchronized with the sweep of the beam across the face of the cathode ray tube.

It is not necessary to use a digital tape recorder to supply "real time" data to the recorder of the present invention. Instead, the well logging measurements could be applied directly to the present recorder. Turning to FIG. 19, there is shown such an arrangement. The well logging measurements from signal processing circuits 304 are applied directly to parallel sample and hold circuits 320. To strobe the circuits 320, a depth pulse generator 321 generates a pulse each given incremental movement of the shaft 313. These depth pulses also energize the sweep pulse generator 323 which performs the same function as the generator 315 of FIG. 18.

To provide the depth information to the recording equipment of the present invention, the shaft 313 is connected to a depth encoder 323 which can, if desired, take the form of the depth encoder illustrated in the Miller et al tape recorder patent. The digitized depth data is then transferred to the depth determination circuits 60 of FIG. 1. In this FIG. 19 case, the data could be transferred in parallel to the circuits 60 thus eliminating the necessity of shift pulses and the shift pulse window.

It can thus be seen from the foregoing that new and improved methods and apparatus have been provided for recording well logging data. This has been accomplished by utilizing a cathode ray tube for recording such signals. A recording system has been shown and described which not only can record data as it is being derived from a well logging tool in a borehole, but can also record data being transmitted or received over a telemetry link as well as data which has been previously recorded on magnetic tape and then played back to the recorder. The recorder of the present invention can provide any desired pattern of scale and depth lines. Moreover, this recorder is able to produce any number of line and area coding patterns as desired to thereby enable easy identification of not only individual logs recorded on the recording medium, but also parameters represented by the areas between certain selected logs. This coding can be conditional by allowing area coding only when these logs maintain certain selected relationships to one another. Moreover, good quality recordings can be obtained regardless of the rate of change of the signals to be recorded.

It should be pointed out here that the techniques of the present inventions could be used with other types of recording devices than the fiberoptic CRT shown here. For example, an electrostatic recorder could be used just as well. Such an electrostatic recorder would have a plurality of wire ends positioned transversely across a record medium. The proper wire end would be energized to produce a mark at the proper position.

While there has been described what is at present considered to be preferred embodiments of this invention, it will be obvious to those skilled in the art that various changes and modifications may be made in the instrument without departing from the invention, and it is, therefore, intended to cover all such changes and modifications as fall within the true spirit and scope of the invention.

I claim:

1. The method of producing a graphic display of the condition of a signal, comprising the steps of analyzing said signal to derive a succession of values, each of which represents a successive condition of said signal, and producing successive substantially parallel lines on a display medium, each of said lines being substantially continuous and extending between two points, the positions of which represent, respectively, a corresponding two, consecutively derived ones, of said values.

2. The method of claim 1, wherein the last-recited step consists of repeatedly marking a record medium by a recording means to record said lines on said medium, and wherein there is provided the additional step of moving said record medium relative to said recording means in a direction substantially at right angles to said lines.

3. The method of claim 1, wherein the first-recited step consists of repeatedly sampling the value of said signal, wherein said successively derived values represent successive sampled values of said signal, and wherein the positions of the said points terminating each of said lines represent, respectively, the presently sampled value of said signal and the immediately previously sampled value of said signal.

4. The method of claim 3, wherein said sampling step includes repeatedly sweeping the value of a second signal progressively between first and second values at a predetermined rate, comparing the value of the first-mentioned signal to the value of said second signal during each of said sweeps of the latter, and detecting, for each of said sweeps, the occurrence of a predetermined relationship between the values of said first-mentioned and second signals, and wherein said producing step consists of producing, for each of said sweeps, one of said lines on a display medium, each of said lines extending between two points the positions of which represent respectively the presently sampled value of said signal and the immediately previously sampled value of said signal.

5. The method of claim 4, wherein the last-recited step includes activating a display medium marking means during each of said sweeps only for the time period in which the value of said second signal lies between the presently sampled value of said signal and the immediately previously sampled value of said signal, and applying said second signal to effectively sweep said marking means across said display medium in synchronism with said sweeping of said second signal value.

6. The method of claim 5, wherein the last-mentioned step includes producing a cathode ray tube beam during each of said sweeps only for the time period in which the value of said second signal lies between the presently sampled value of said signal and the immediately previously sampled value of said signal, and sweeping said beam across the face of said tube in synchronism with said sweeping of said second signal.

7. The method of claim 5, wherein said activating step includes producing a first output signal upon each detection of said occurrence, producing a second output signal subsequent to the production of each of said first output signals by a selected time period, activating said display medium marking means during each of said sweeps upon the production of the one of said first and second output signals which is produced earliest during that sweep, and deactivating said marking means upon the production of the other of said output signals during the last-mentioned sweep.

8. The method of claim 5, wherein said activating step includes changing an output signal from a first to a second value for a period equal to the reciprocal of said sweep rate upon every other detection of said occurrence, changing another output signal from a first to a second value for a period equal to the reciprocal of said sweep rate upon every intervening detection of said occurrence, activating said display medium marking means during each of said sweeps upon the occurrence of the first output signal change to occur during that sweep, and deactivating said marking means upon the occurrence of the second output signal change to occur during the last-mentioned sweep.

9. Apparatus for producing a graphic display of the condition of a data signal, comprising first means connected to the source of said signal for deriving a succession of values, each of which represents a successive condition of said signal, and second means connected to said first means for producing successive substantially parallel lines on a display medium, each of said lines being substantially continuous and extending between two points, the positions of which represent, respectively, a corresponding two, consecutively derived ones, of said values.

10. Apparatus as specified in claim 9, wherein said display medium is a record medium, wherein said second means includes recording means and means to cause said recording means to record said lines on said record medium, and wherein there is included means for moving said record medium relative to said recording means in a direction substantially at right angles to said lines.

11. Apparatus as specified in claim 10, wherein said first means includes sampling means for repeatedly sampling the value of said signal to cause said successively derived values to represent successive sampled values of said signal, and wherein the positions of the said points terminating each of said lines represent, respectively, the presently sampled values of said signal and the immediately previously sampled value of said signal.

12. Apparatus as specified in claim 11, wherein said sampling means includes generating means for producing a ramp signal the value of which repeatedly sweeps progressively between first and second values, and comparing means connected to receive and to compare said data and ramp signals for producing a first output signal upon the occurrence of a predetermined relationship between the values of said data and ramp signals for each of said sweeps of the latter, and wherein said second means includes circuit means connected to said comparing means and controlled by said output signal to cause the position of one of said points for any given one of said lines to represent the value of said data signal at the time of the production of said output signal of the present one of said sweeps, and to cause the position of the other of said points for that line to represent the value of said data signal at a selected prior time of the production of said output signal.

13. Apparatus as specified in claim 12, wherein said second means includes display medium marking means and scanning means connected to said generating means for effectively sweeping said marking means across said display medium in synchronism with said sweeping of said ramp signal value, and wherein said circuit means includes activating means for activating said marking means to cause it to mark said medium only for the time period during each of said sweeps in which the value of said ramp signal lies between the values had by said data signal at the time of the production of said output signal for the present sweep and at a selected prior time.

14. Apparatus as specified in claim 13, wherein said marking means includes means for producing a cathode ray tube beam.

15. Apparatus as specified in claim 13, wherein said circuit means includes delay means for producing in each of said sweeps a second output signal at the time at which said ramp signal reaches the value at which said first output signal was produced during an immediately previous time period, and control means responsive to said first and second output signals and connected to said activating means to activate said marking means in each sweep upon the production of the one of said first and second output signals which is produced first in that sweep upon the production of the one of said first and second output signals which is produced last in that sweep.

16. The method of providing a graphic display representative of the values of each of a plurality of data signals comprising the steps of repeatedly producing a comparison signal, simultaneously comparing all of said data signals to said comparison signal during each production of the latter, and producing, for each of said data signals during each production of said comparison signal, a substantially continuous line extending between two points on a common display medium, the positions of which points represent, respectively, the presently compared value of said corresponding data signal and the immediately previously compared value of said corresponding data signal.

17. Apparatus for producing a graphic display representative of the values of each of a plurality of data signals, comprising generating means for repeatedly producing a comparison signal, comparing means connected to receive said comparison and data signals and to compare said comparison signal to all of said data signals simultaneously during each production of said comparison signal, and means controlled by said comparing means for producing, for each of said data signals during each production of said comparison signal, a substantially continuous line extending between two points on a common display medium, the positions of which points represent, respectively, the presently compared value of said corresponding data signal and the immediately previously compared value of said corresponding data signals.

18. The method of producing a graphic display of the condition of a data signal, comprising the steps of:
repeatedly sampling the value of said data signal to derive a succession of values representative of a successive condition of said data signal;
comparing the amplitude of the presently sampled value of said data signal with the immediately previously sampled value of said data signal and generating a first pulse whose width is proportional to the difference;
generating a second pulse of predetermined pulse width during each sampling of the value of said data signal;
combining said first and second pulses to produce a writing signal pulse whose width is proportional to the width of the wider of the first and second pulses; and
producing successive substantially parallel lines on a display medium, each of said lines being substantially continuous and having a length proportional to the width of said writing signal.

19. Apparatus for producing a graphic display of the condition of a data signal, comprising:
sampling means for repeatedly sampling the value of said data signal to derive a succession of values representative of a successive condition of said data signal;
comparing means for comparing the presently sampled value of said data signal with the immediately previously sampled value of said data signal and generating a first pulse whose width is proportional to the difference;
pulse generating means operative each sampling of the value of said data signal for generating a second pulse of predetermined pulse width;
combining means for combining said first and second pulses to produce a writing pulse signal whose width is proportional to the width of the wider of the first and second pulses; and
recording means for recording successive substantially parallel lines, each of said lines being substantially continuous and having a length proportional to the width of said writing pulse signal.

20. Apparatus for coding the area between two data signals that are recorded, comprising:
a recording medium;
means responsive to selected samples of said data signals for producing writing signals;
means for generating a coding pattern signal adapted to result in a series of dots when recorded on said recording medium; and
means responsive to said coding pattern and writing signals for producing a coding pattern of dots between boundaries on said recording medium, said boundaries being representative of said data signals.

21. The apparatus of claim 20 wherein said means for generating inhibits the coding pattern signal at various points along the recording medium to produce a coding pattern in the form of bands of dots.

22. Apparatus for coding the area between two data signals that are recorded, comprising:
a recording medium;
means responsive to selected samples of said data signals for producing writing signals;
means for generating a coding pattern signal adapted to result in a series of dashes at various points along said recording medium when recorded on said recording medium; and
means responsive to said coding pattern and writing signals for producing a coding pattern of dashes between boundaries on said recording medium, said boundaries being representative of said data signals.

23. The apparatus of claim 22 wherein said dashes are contiguous end to end and said means for generating further produces a coding pattern signal that results in a series of diagonal dashes when recorded on said recording medium, said diagonal dashes connecting the contiguous dashes at various points along the recording medium.

24. The apparatus of claim 22 wherein said dashes are contiguous end to end and said means for generating further produces a coding pattern signal that results in a series of horizontal dashes when recorded on said recording medium, said horizontal dashes being perpendicular to and connecting the contiguous dashes at various points along the recording medium.

25. Apparatus for coding the area between two data signals that are recorded, comprising:
a recording medium;
means responsive to selected samples of said data signals for producing writing signals;

means for generating a coding pattern signal adapted to result in a series of diagonal lines when recorded on said recording medium; and means responsive to said coding pattern and writing signals for producing a coding pattern of diagonal lines between boundaries on said recording medium, said boundaries being representative of said signals.

26. Apparatus for coding the area between two data signals that are recorded, comprising a recording medium;

means for generating length signals representative of changes in the time at which said data signals are produced;

means for generating scale signals representative of selected ranges of amplitude values of said data signals;

means for generating a writing signal that controls the recording of indicia on said recording medium, said writing signal being produced in response to selected samples of said data signals, said length signals and said scale signals in order to record the data signals on said recording medium on a grid of length and scale lines; and means for generating a coding pattern signal related to the area between the two data signals on said recording medium, said coding pattern signal inhibiting the production of length lines in the area between the two data signals.

27. Apparatus as claimed in claim 55 wherein said coding pattern further inhibits the production of scale lines in the area between the two data signals.

* * * * *

UNITED STATES PATENT AND TRADEMARK OFFICE
CERTIFICATE OF CORRECTION

PATENT NO. : 4,010,476
DATED : March 1, 1977
INVENTOR(S) : Jennings W. Elliott

It is certified that error appears in the above-identified patent and that said Letters Patent are hereby corrected as shown below:

First page, Item [60], "which is a continuation of Ser. No. 520,956, Nov. 4, 1974" should read -- which was refiled on November 4, 1974 as continuation application Serial No. 520,956 --;

Column 4, line 65, "or" should read -- of --;

Column 6, line 8, "writted" should read -- written --;

Column 7, line 67, "231" should read -- 31 --;

Column 8, line 23, "upset" should read -- swept --;

Column 9, line 37, "As discussed" should start a new paragraph;

Column 10, line 64, "circuit" should read -- circuit" --;

Column 11, line 66, after "by" insert -- Miller et al --;

Column 12, line 10, "the" should be -- The --;

Column 13, line 16, "and" should read -- an --;

Column 13, line 22, "hundred" should read -- hundreds --;

Column 14, line 9, "2" should read -- 112 --;

Column 17, line 19, "reached" should read -- recorded --;

Column 20, line 18, "he" should read -- the --;

Column 20, line 22, "the inversion" should read -- for inversion --

UNITED STATES PATENT AND TRADEMARK OFFICE
CERTIFICATE OF CORRECTION

PATENT NO. : 4,010,476

DATED : March 1, 1977

INVENTOR(S) : Jennings W. Elliott

It is certified that error appears in the above-identified patent and that said Letters Patent are hereby corrected as shown below:

Column 20, line 50, "pulse" should read -- pulses --;

Column 21, line 21, "starter" should read -- start --;

Column 22, line 24, "an" should read -- and --;

Column 23, line 20, "stops" should read -- stop --;

Column 24, line 4, "causes" should read -- cause --;

Column 24, line 52, "alternatley" should read -- alternately --;

Column 24, line 63, before "AND" insert -- an --;

Column 25, line 32, "a" should read -- at --;

Column 26, line 34, "line" second occurrence should read -- lines --;

Column 27, line 32, "means" should read -- beam --;

UNITED STATES PATENT OFFICE
CERTIFICATE OF CORRECTION

Patent No. 4,010,476          Dated March 1, 1977

Inventor(s) Jennings W. Elliott

It is certified that error appears in the above-identified patent and that said Letters Patent are hereby corrected as shown below:

Column 34, line 24, "claim 10" should read -- claim 9 --;

Column 34, line 30, "values" should read -- value --; and

Column 38, line 16, "claim 55" should read -- claim 26 --.

Signed and Sealed this

Twenty-fourth Day of May 1977

[SEAL]

Attest:

RUTH C. MASON
Attesting Officer

C. MARSHALL DANN
Commissioner of Patents and Trademarks